(12) United States Patent
Nakagawa et al.

(10) Patent No.: US 8,305,315 B2
(45) Date of Patent: Nov. 6, 2012

(54) MONOLITHIC DRIVER-TYPE DISPLAY DEVICE

(75) Inventors: Yousuke Nakagawa, Osaka (JP); Kazuhiro Maeda, Osaka (JP); Ichiro Shiraki, Osaka (JP); Shuji Nishi, Osaka (JP); Sachio Tsujino, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 398 days.

(21) Appl. No.: 12/733,884

(22) PCT Filed: Jun. 19, 2008

(86) PCT No.: PCT/JP2008/061206
§ 371 (c)(1),
(2), (4) Date: Mar. 25, 2010

(87) PCT Pub. No.: WO2009/050920
PCT Pub. Date: Apr. 23, 2009

(65) Prior Publication Data
US 2010/0259565 A1    Oct. 14, 2010

(30) Foreign Application Priority Data

Oct. 18, 2007 (JP) ................................. 2007-270936

(51) Int. Cl.
*G09G 3/36* (2006.01)
(52) U.S. Cl. ............... 345/87; 345/89; 345/90; 345/690; 345/98; 345/204
(58) Field of Classification Search .................... 345/87, 345/89, 90, 92, 98, 100, 204, 690
See application file for complete search history.

(56) References Cited

U.S. PATENT DOCUMENTS

| 7,038,645 | B2 * | 5/2006 | Ozawa et al. | .................... 345/89 |
| 7,319,462 | B2 * | 1/2008 | Ogawa et al. | .................. 345/204 |
| 7,944,458 | B2 * | 5/2011 | Kwon et al. | .................. 345/690 |
| 2002/0030620 | A1 | 3/2002 | Cairns et al. | |

(Continued)

FOREIGN PATENT DOCUMENTS

JP            08-179277            7/1996
(Continued)

OTHER PUBLICATIONS

International Search Report.

*Primary Examiner* — Quan-Zhen Wang
*Assistant Examiner* — Jennifer Nguyen
(74) *Attorney, Agent, or Firm* — Harness, Dickey & Pierce, P.L.C.

(57) ABSTRACT

The present invention aims to provide a monolithic driver-type display device capable of reducing circuit scale of a sampling circuit, and keeping low power consumption by directly driving a source driver with an externally provided video signal.

In the monolithic driver-type display device having a display portion for displaying video and circuits for driving the display portion formed on the same insulating substrate, a plurality of sampling switches are provided in association with a plurality of pieces of bit data contained in externally inputted digital video signals. The sampling switches are opened/closed based on sampling signals, thereby sampling the digital video signals for each piece of the bit data and converting the signals into parallel format for output to data lines. The outputted digital video signals charge parasitic capacitances on the data lines and are held therein.

12 Claims, 16 Drawing Sheets

U.S. PATENT DOCUMENTS

| | | |
|---|---|---|
| 2003/0184534 A1 | 10/2003 | Ogawa et al. |
| 2005/0280613 A1* | 12/2005 | Takei et al. .................. 345/76 |
| 2007/0152923 A1 | 7/2007 | Baik et al. |

FOREIGN PATENT DOCUMENTS

| | | |
|---|---|---|
| JP | 09-244583 | 9/1997 |
| JP | 2002-057959 | 2/2002 |
| JP | 2002-156952 | 5/2002 |
| JP | 2004-004508 | 1/2004 |
| JP | 2006-003752 | 1/2006 |
| JP | 2006-173812 | 6/2006 |
| JP | 2006-267544 | 10/2006 |
| JP | 2007-121485 | 5/2007 |
| JP | 2007-183613 | 7/2007 |
| TW | 200403618 | 3/2004 |

* cited by examiner

F I G. 6
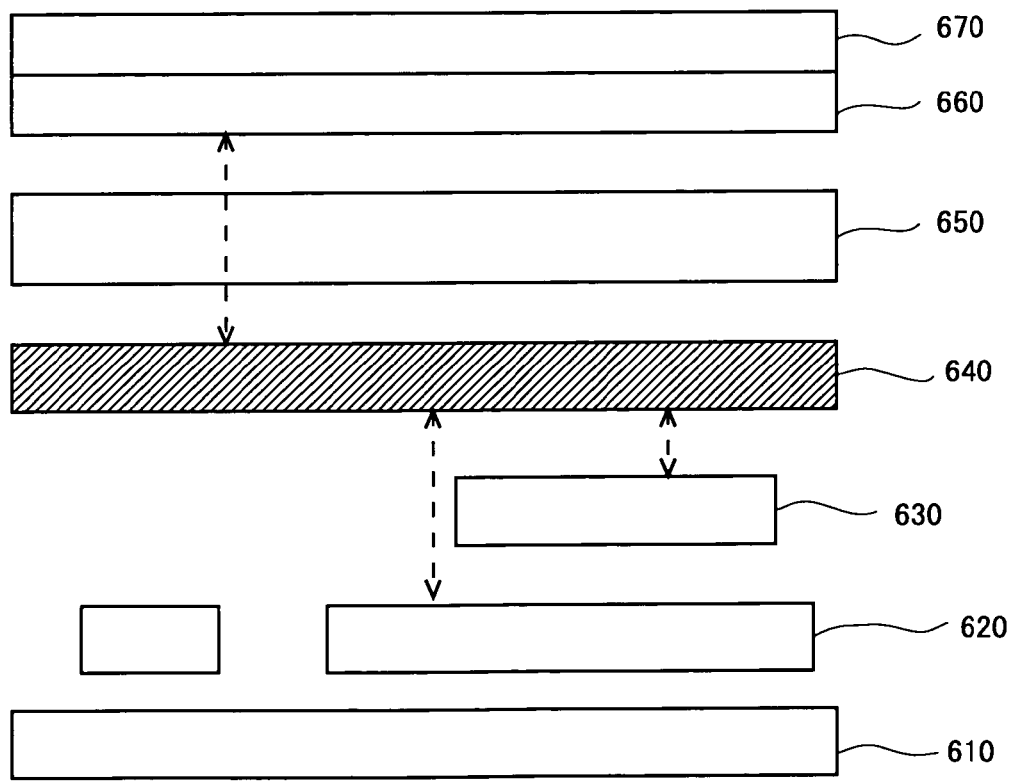

FIG. 8
(A)
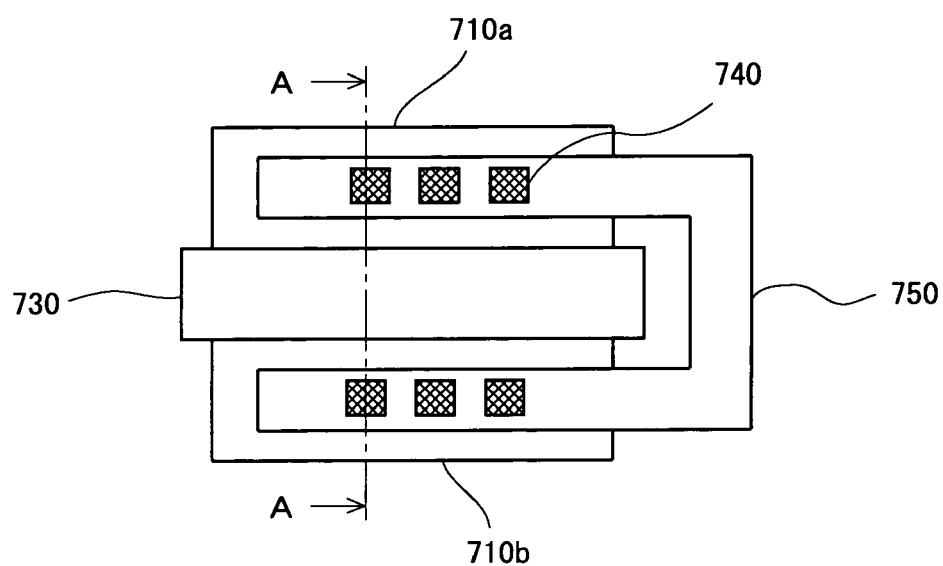
(B)
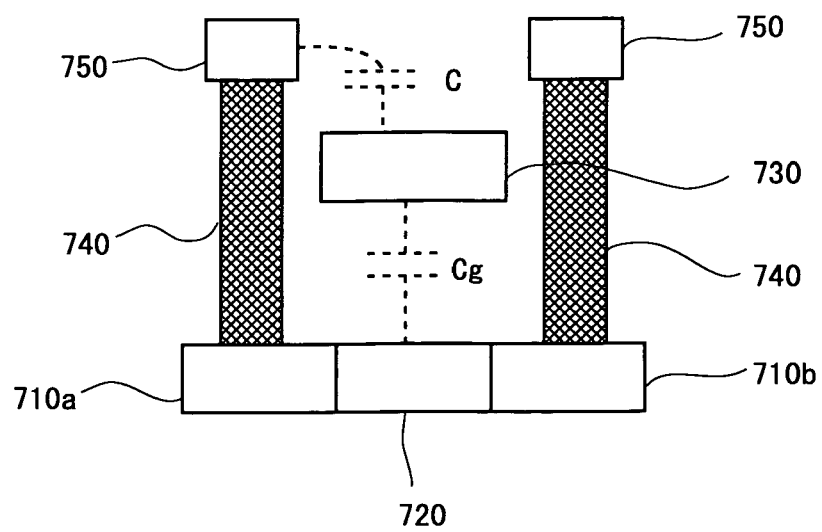

F I G. 9
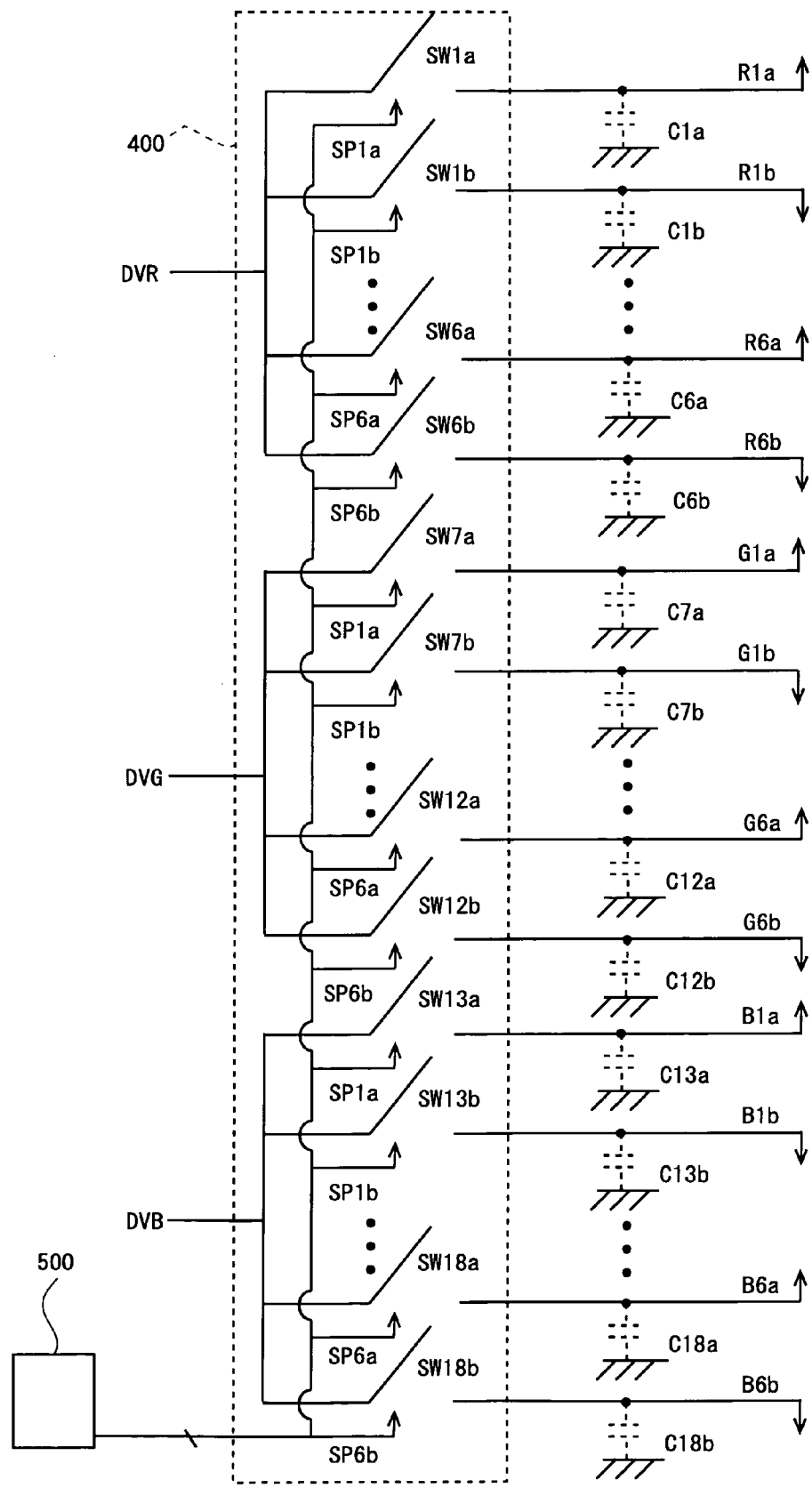

F I G. 1 1
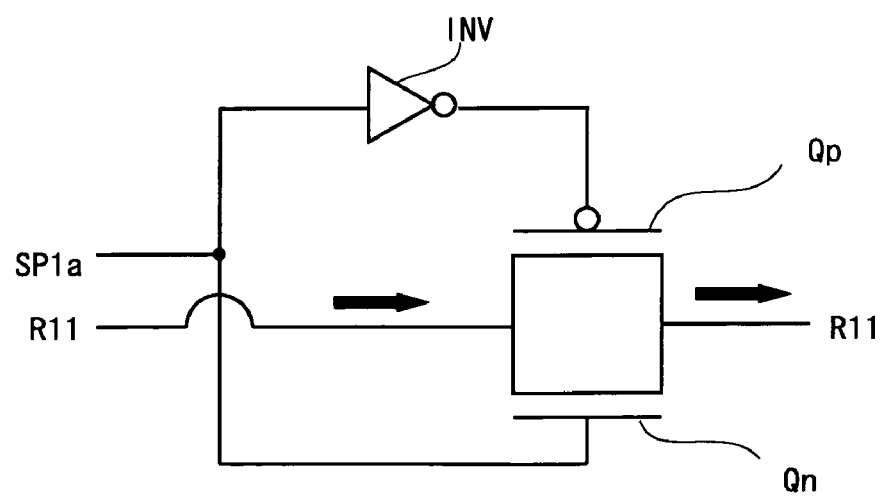

MONOLITHIC DRIVER-TYPE DISPLAY DEVICE

TECHNICAL FIELD

The present invention relates to a monolithic driver-type display device in which a display portion for providing a gradation display of video and circuits for driving the display portion are formed on the same insulating substrate.

BACKGROUND ART

In conventional monolithic driver-type display devices, apart from a video signal line driver circuit (hereinafter, referred to as a "source driver") and a scanning signal line driver circuit (hereinafter, referred to as a "gate driver"), logic circuits, such as D-type flip-flop circuits for converting serial-format digital video signals (hereinafter, the "digital video signal" being referred to as the "video signal") into parallel-format video signals, are formed in a silicon layer made of, for example, continuous grain silicon (hereinafter, referred to as "CG silicon") deposited on an insulating substrate. In this case, in order for the logic circuits to convert video signals, which are low-voltage swing signals in serial format, into parallel format, it is necessary to increase the swing of the inputted video signals to the level of the power-supply voltage of the logic circuits. However, when the source driver is driven using the video signals having a high voltage swing increased by the logic circuits for serial-parallel conversion, parasitic capacitances on data lines formed on the insulating substrate increase, resulting in increased power consumption of the display device.

Accordingly, in Japanese Laid-Open Patent Publication No. 2006-173812, video signals having their voltage swing increased by level adjustment circuits are subjected to serial-parallel conversion by logic circuits, and thereafter the voltage swing of the video signals is reduced by level-down converters for output to the source driver. Therefore, it is not necessary to use video signals with an increased voltage swing to drive the source driver through data lines with increased parasitic capacitances, so that power consumption of the display device can be kept low.

Also, in Japanese Laid-Open Patent Publication No. 9-244583, an analog video signal is expanded into three phases by three sampling switches, and then held in capacitors, and analog video signals with their black levels fixed by clampers are supplied to the display portion.

[Patent Document 1] Japanese Laid-Open Patent Publication No. 2006-173812
[Patent Document 2] Japanese Laid-Open Patent Publication No. 9-244583

DISCLOSURE OF THE INVENTION

Problems to be Solved by the Invention

However, in the case of Patent Document 1 where video signals are converted from serial to parallel format by the logic circuits formed on the insulating substrate, it is necessary to additionally provide the level adjustment circuits for increasing the voltage swing of the video signals and the level-down converters for reducing the voltage swing of the video signals subjected to serial-parallel conversion. Therefore, circuit scale required for serial-parallel conversion is increased, along with power consumption required for driving such circuits.

In the case of Patent Document 2, a signal to be inputted to a sample and hold circuit is an analog video signal, and a capacitor needs to be provided for each data line in order to hold a video signal to be outputted to the data line.

Therefore, an objective of the present invention is to provide a monolithic driver-type display device capable of reducing circuit scale for sampling and latching video signals, and keeping low power consumption by directly driving a source driver with an externally provided video signal.

Solution to the Problems

A first aspect of the present invention is directed to a monolithic driver-type display device for providing a gradation display of video, comprising:
a first insulating substrate;
a display portion including a plurality of scanning signal lines, a plurality of video signal lines crossing the scanning signal lines, and a plurality of display elements arranged in a matrix at their corresponding intersections between the scanning signal lines and the video signal lines;
a scanning signal line driver circuit for selectively activating the scanning signal lines;
a plurality of switching elements provided in association with a plurality of pieces of bit data contained in externally inputted digital video signals and sampling the digital video signals for each piece of the bit data;
a sampling signal generation circuit for generating sampling signals for opening/closing the switching elements;
a video signal line driver circuitry for amplifying the sampled digital video signals in such a swing as to enable processing, thereafter generating analog video signals by selecting one gradation voltage for each analog video signal from among a group of provided gradation voltages, based on the amplified digital video signals, and outputting the generated analog video signals to the video signal lines; and
a plurality of data lines provided between the switching elements and the video signal line driver circuitry, the data lines each having a parasitic capacitance, wherein,
at least the display portion and the video signal line driver circuitry are formed on the first insulating substrate, and
the switching elements are independently opened/closed based on the sampling signals, thereby performing a sample and hold operation for sampling and outputting the digital video signals for each piece of the bit data to the data lines, whereby the outputted digital video signals are held in the parasitic capacitances on the data lines.

In a second aspect of the present invention, based on the first aspect of the invention, the digital video signals each contain a parallel video signal having the pieces of bit data arranged in bit-parallel form, the switching elements include a plurality of sets of switching elements, one set being provided for each piece of the bit data, and the sampling signal generation circuit generates the sampling signals such that, each time a piece of the bit data for the parallel video signal is externally inputted, the switching elements in the same set are sequentially opened/closed and switching elements, one selected from each set, are simultaneously opened/closed.

In a third aspect of the present invention, based on the first aspect of the invention, the digital video signals each contain a serial video signal having the pieces of bit data arranged in bit-serial form, and the sampling signal generation circuit generates the sampling signals such that, each time a piece of the bit data for the serial video signal is inputted, the switching elements are sequentially opened/closed.

In a fourth aspect of the present invention, based on the first aspect of the invention, the digital video signals each contain a predetermined number of color video signals representing color video composed of the predetermined number of colors and having a plurality of pieces of bit data arranged in bit-serial form for each of the predetermined number of colors, the switching elements include a predetermined number of sets of switching elements, each set corresponding to the pieces of bit data for one of the color video signals, and the sampling signal generation circuit generates the sampling signals such that, each time a piece of the bit data for the color video signal is externally inputted, the sampling elements in the same set are sequentially opened/closed and switching elements, one selected from each set, are simultaneously opened/closed.

In a fifth aspect of the present invention, based on the first aspect of the invention, the switching elements are analog switching elements.

In a sixth aspect of the present invention, based on the first aspect of the invention, the video signal line driver circuitry includes MOS thin-film transistors each having a channel of either a first or second conductivity type, and the switching elements are formed by MOS thin-film transistors each having a channel of the same conductivity type as the MOS thin-film transistors included in the video signal line driver circuitry.

In a seventh aspect of the present invention, based on the first aspect of the invention, the video signal line driver circuitry includes a first video signal line driver circuit provided on one side of the display portion, and a second video signal line driver circuit provided on a side opposite to the one side, the switching elements include a first set of switching elements for sampling the digital video signals to be outputted to the first video signal line driver circuit, and a second set of switching elements for sampling the digital video signals to be outputted to the second video signal line driver circuit, and the first set of switching elements and the second set of switching elements are complementarily opened/closed based on the sampling signals, thereby outputting the digital video signals to either the first or second video signal line driver circuit.

In an eighth aspect of the present invention, based on the first aspect of the invention, further comprised is a second insulating substrate opposed to the first insulating substrate and having an electrode positioned to at least face the data lines, the data lines each having the parasitic capacitance formed between the data line and the electrode.

In a ninth aspect of the present invention, based on the first aspect of the invention, further comprised is a silicon layer formed on the first insulating substrate, the data lines each having the parasitic capacitance formed between the data line and wiring formed in the silicon layer.

In a tenth aspect of the present invention, based on the ninth aspect of the invention, further comprised is a wiring layer formed above the silicon layer with the first insulating film positioned therebetween, the wiring layer being different from a wiring layer in which the data lines are formed, the data lines each having the parasitic capacitance formed between the data line and wiring formed in the different wiring layer.

In an eleventh aspect of the present invention, based on the tenth aspect of the invention, further comprised are MOS transistors each having a source and a drain formed in the silicon layer on the first insulating substrate and a gate formed in the different wiring layer, the data lines being each connected to the source and the drain and having the parasitic capacitance formed between the data line and the gate with a gate capacitance of the MOS transistor intervening therebetween.

In a twelfth aspect of the present invention, based on the first aspect of the invention, the data lines each have the parasitic capacitance formed between the data line and wiring formed in the same wiring layer as the wiring layer in which the data lines are formed.

Effect of the Invention

According to the first aspect of the invention, the monolithic driver-type display device has a plurality of switching elements provided in association with a plurality of pieces of bit data contained in externally inputted digital video signals. The switching elements are opened/closed based on sampling signals, thereby sampling the digital video signals for each piece of the bit data, and charging parasitic capacitances formed on data lines. Specifically, by using the switching elements, the externally provided digital video signals are held in the parasitic capacitances without being boosted, and thereafter the signals are provided to a video signal line driver circuitry in which they are boosted. Accordingly, it is possible to simplify the configuration of a circuit to be formed on an insulating substrate for sampling and holding the digital video signals to be provided to the video signal line driver circuitry, and therefore circuit scale for the display device can be reduced when compared to the case where logic circuits are used. Also, since the digital video signals are provided to the video signal line driver circuitry via data lines with high parasitic capacitance without being boosted, power consumption of the display device can be kept low.

According to the second aspect of the invention, each time a parallel video signal having a plurality of pieces of bit data arranged in bit-parallel form is provided for each piece of the bit data to a plurality of sets of switching elements, switching elements, one selected from each set, are sequentially closed. At this time, pieces of bit data corresponding to the closed switching elements in the sets are simultaneously outputted. Thus, the parallel video signal can be expanded into phases the number of which corresponds to the number of sets.

According to the third aspect of the invention, each time a serial video signal having a plurality of pieces of bit data arranged in bit-serial form is provided for each piece of the bit data to a plurality of sets of switching elements, the switching elements are sequentially opened/closed. At this time, pieces of bit data corresponding to the closed switching elements are outputted therefrom, and held in parasitic capacitances formed in association with the switching elements. Thus, the serial video signal can be converted into a digital video signal having a plurality of pieces of bit data arranged in bit-parallel form.

According to the fourth aspect of the invention, each time pieces of bit data for color video signals representing color video composed of a predetermined number of colors and having a plurality of pieces of bit data arranged in bit-serial form for each color are provided to switching elements provided for each color, the switching elements for that color are sequentially opened/closed and switching elements, one selected for each color, are simultaneously opened/closed. At this time, pieces of bit data corresponding to the closed switching elements for their respective colors are outputted, not simply, but simultaneously, and they are held in parasitic capacitances formed in association with the switching elements. Thus, a color video signal having pieces of bit data arranged in bit-serial form can be converted into bit-parallel form.

According to the fifth aspect of the invention, the switching elements are formed by analog switching elements, and therefore can be formed simultaneously with formation of, for example, the video signal line driver circuitry on the first insulating substrate. Thus, the process for producing them can be simplified.

According to the sixth aspect of the invention, the switching elements are formed by MOS thin-film transistors of the same conductivity type as the MOS thin-film transistors included in the video signal line driver circuitry, and therefore the process for producing the display device can be simplified.

According to the seventh aspect of the invention, two video signal line driver circuits and two sets of switching elements are both provided in opposing arrangement around the display portion, and therefore the video signal line driver circuitry can have output terminals spaced at wide intervals. Thus, the video signal line driver circuitry can be readily connected to the display portion. Also, the transmission frequency of a digital video signal can be divided by a plurality of switching elements and a plurality of parasitic capacitances.

According to the eighth aspect of the invention, the data lines each have a parasitic capacitance formed between the data line and an electrode formed on the second insulating substrate opposed to the first insulating substrate on which the data lines are formed. Thus, by using the parasitic capacitance, a digital video signal subjected to serial-parallel conversion can be held without providing any additional capacitance.

According to the ninth aspect of the invention, the data lines each have a parasitic capacitance formed between the data line and wiring formed in a silicon layer on the first insulating substrate. Thus, the same effect as that achieved by the eighth aspect can be achieved.

According to the tenth aspect of the invention, the data lines each have a parasitic capacitance formed between the data line and wiring formed in a wiring layer above the silicon layer. Thus, the same effect as that achieved by the eighth aspect can be achieved.

According to the eleventh aspect of the invention, MOS transistors are formed on the first insulating substrate, and the data lines are connected to sources and drains of the MOS transistors, so that parasitic capacitances are formed between the data lines and gates. Thus, the same effect as that achieved by the eighth aspect can be achieved.

According to the twelfth aspect of the invention, the data lines each have a parasitic capacitance formed between the data line and wiring formed in the same wiring layer as the wiring layer in which the data lines are formed. Thus, the same effect as that achieved by the eighth aspect can be achieved.

BRIEF DESCRIPTION OF THE DRAWINGS

FIG. 6 is a cross-sectional view illustrating in cross-section the liquid crystal display device in the first embodiment.

FIG. 8(A) is a top view illustrating a parasitic capacitance utilizing a gate capacitance of a MOS transistor used in the first embodiment.

FIG. 8(B) is a cross-sectional view taken along line A-A in FIG. 8(A).

FIG. 9 is a detailed circuit diagram of a sampling circuit in a first variant of the first embodiment.

FIG. 11 is a diagram illustrating the configuration of a sampling switch in the first variant.

Figure 1:
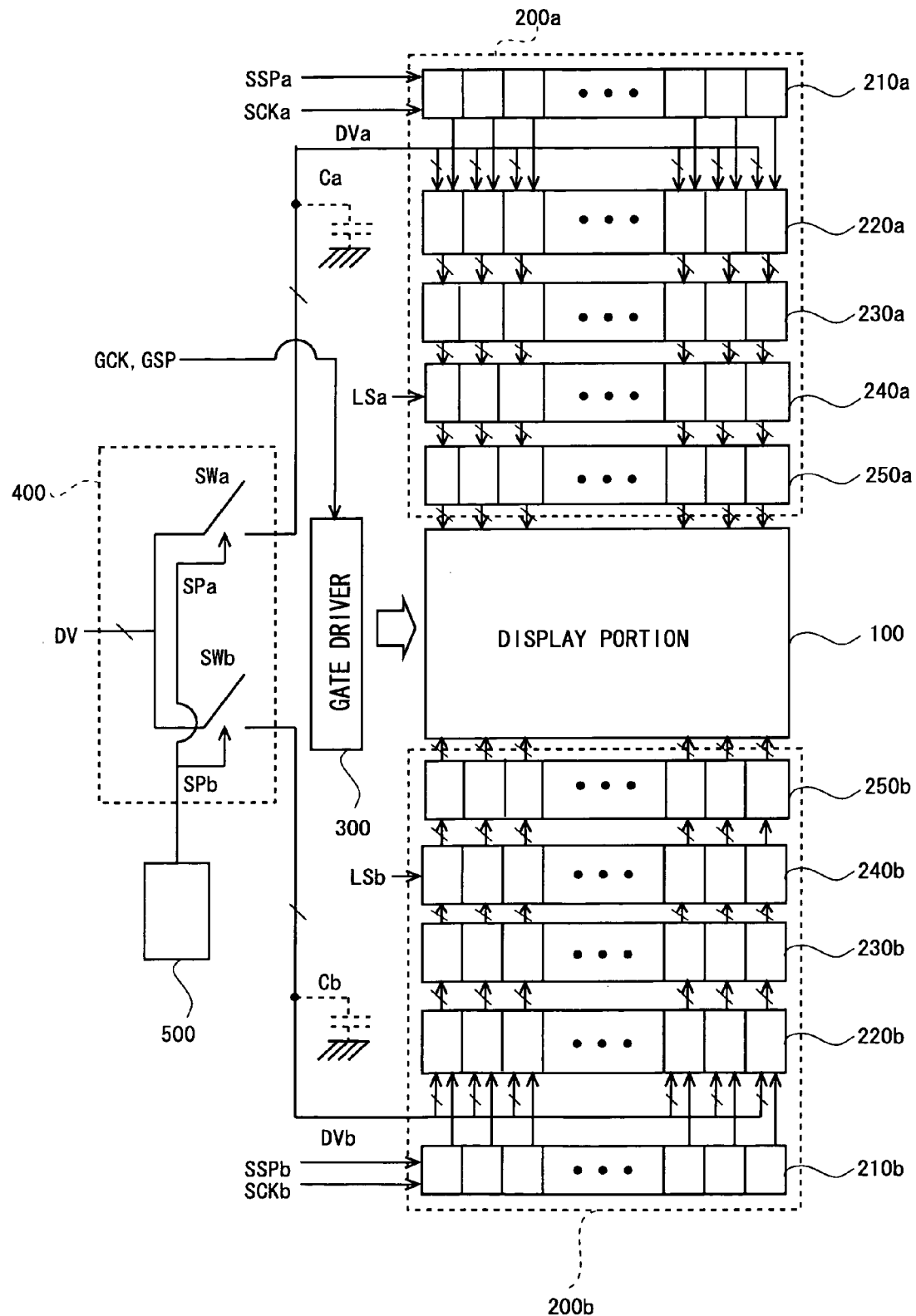
FIG. 1 is a block diagram illustrating the configuration of a liquid crystal display device according to a first embodiment of the present invention.

DESCRIPTION OF THE REFERENCE CHARACTERS 100 display portion
200$a$, 200$b$, 200A to 200N source driver (video signal line driver circuit)
220$a$, 220$b$ level-conversion circuit
230$a$, 230$b$ first latch circuit
300 gate driver (scanning signal line driver circuit)
400, 400A to 400N sampling circuit
500 sampling signal generation circuit
610 TFT-side substrate (TFT-side glass substrate)
620 CG silicon layer
630 polysilicon layer
640 metal layer
660 opposing electrode
670 CF-side substrate (color filter-side glass substrate)
710$a$ source
710$b$ drain
720 channel region
730 gate
740 contact hole
750 data line
800A to 800N change-over switch
R1$a$ to B6$b$, 900A$a$ to 900N$b$ data line
Ca, Cb, C1$a$ to C18$b$ parasitic capacitance
SPa, SPb, SP1$a$ to SP18$b$, SP1$a$ to SP6$b$, SPR1$a$ to SPB6$b$ sampling signal
SWa, SWb, SW1$a$ to SW18$b$ sampling switch

BEST MODE FOR CARRYING OUT THE INVENTION

Hereinafter, embodiments of a display device according to the present invention will be described with reference to the drawings.

1. First Embodiment

<1.1 Overall Configuration>

FIG. 1 is a block diagram illustrating the configuration of a liquid crystal display device according to a first embodiment of the present invention. The liquid crystal display device includes a display portion 100 consisting of a plurality of pixels (display elements) arranged in a matrix. Each of the pixels is provided with color filters of red (R), green (G), and blue (B) in the horizontal direction. Accordingly, for example, when a video signal DV containing 6-bit data is inputted for each color, color video of about 260,000 tones is displayed on the display portion 100.

Source drivers 200a and 200b are provided respectively above and below the display portion 100 for generating drive video signals for driving the pixels. Also, a gate driver 300 is provided to the left of the display portion 100 for driving the pixels in the horizontal direction. The source drivers 200a and 200b are connected to a sampling circuit 400 for sampling an externally provided video signal DV. The sampling circuit 400 includes two sampling switches SWa and SWb connected in parallel.

Data lines have parasitic capacitances Ca and Cb respectively formed between the sampling switch SWa and the source driver 200a and between the sampling switch SWb and the source driver 200b.

The liquid crystal display device is a so-called monolithic driver-type liquid crystal display device. The monolithic driver-type liquid crystal display device is intended to mean a liquid crystal display device in which the source drivers 200a and 200b, the gate driver 300, and the sampling circuit 400 are formed using a material, such as CG silicon, polysilicon, or amorphous silicon, integrally with the display portion 100 on an insulating substrate such as a glass substrate.

The source drivers 200a and 200b are disposed respectively above and below the display portion 100 because the source drivers 200a and 200b can have output terminals spaced at wider intervals when compared to the case where they are disposed only on one side, so that the source drivers 200a and 200b are readily connected to the display portion 100. Accordingly, for example, the source driver 200a disposed above the display portion 100 outputs drive video signals to odd-numbered video signal lines (hereinafter, referred to as "source bus lines") formed in the display portion 100, whereas the source driver 200b disposed below the display portion 100 outputs drive video signals to even-numbered source bus lines.

<1.2 Source Driver>

Next, the configurations of the source drivers 200a and 200b will be described. As shown in FIG. 1, the source drivers 200a and 200b are each provided with shift registers 210a, 210b, level-conversion circuits 220a, 220b, first latch circuits 230a, 230b, second latch circuits 240a, 240b, D/A converters (hereinafter, referred to as "DACs") 250a, 250b, and a reference voltage generation circuit (not shown).

The shift register 210a receives a source start pulse signal SSPa and a source clock signal SCKa, which are outputted from an external display control circuit (not shown), and the shift register 210b receives a source start pulse signal SSPb and a source clock signal SCKb. Based on the source start pulse signals SSPa and SSPb and the source clock signals SCKa and SCKb, the shift registers 210a and 210b sequentially transfer pulses contained in the source start pulse signals SSPa and SSPb from their input terminals.

The level-conversion circuits 220a and 220b boost video signals DVa and DVb converted into parallel format by the sampling circuit 400, such that the signals can be latched by the subsequent first latch circuits 230a and 230b. The first latch circuits 230a and 230b respectively latch the video signals DVa and DVb boosted by the level-conversion circuits 220a and 220b in accordance with the pulses inputted from the shift registers 210a and 210b.

The video signals DVa and DVb being latched by the first latch circuits 230a and 230b are transferred to the second latch circuits 240a and 240b, respectively. When the video signals DVa and DVb, each corresponding to one horizontal line, are latched by the second latch circuits 240a and 240b, latch strobe signals LSa and LSb are provided from the display control circuit to the second latch circuits 240a and 240b, respectively. Upon respective reception of the latch strobe signals LSa and LSb, the second latch circuits 240a and 240b keep outputting the video signals DVa and DVb to the DACs 250a and 250b, respectively, for one horizontal scanning period. During that period, the first latch circuits 230a and 230b sequentially latch video signals DVa and DVb, respectively, to be outputted during the next horizontal scanning period.

Each of the DACs 250a and 250b selects one gradation display voltage corresponding to the video signal DVa, DVb, from among the group of gradation voltages generated by the reference voltage generation circuit, and outputs the selected voltage to the display portion 100 as a drive video signal.

<1.3 Operation>

The sampling circuit 400 has two sampling switches SWa and SWb connected in parallel. The sampling switches SWa and SWb have their outputs respectively connected to the level-conversion circuits 220a and 220b of the source drivers 200a and 200b via the data lines.

The sampling switches SWa and SWb are respectively controlled to be turned ON/OFF by sampling signals SPa and SPb provided by a sampling signal generation circuit 500. Specifically, each of the sampling switches SWa and SWb is turned ON when a high-level sampling signal is provided and turned OFF when a low-level sampling signal is provided.

Figure 2:
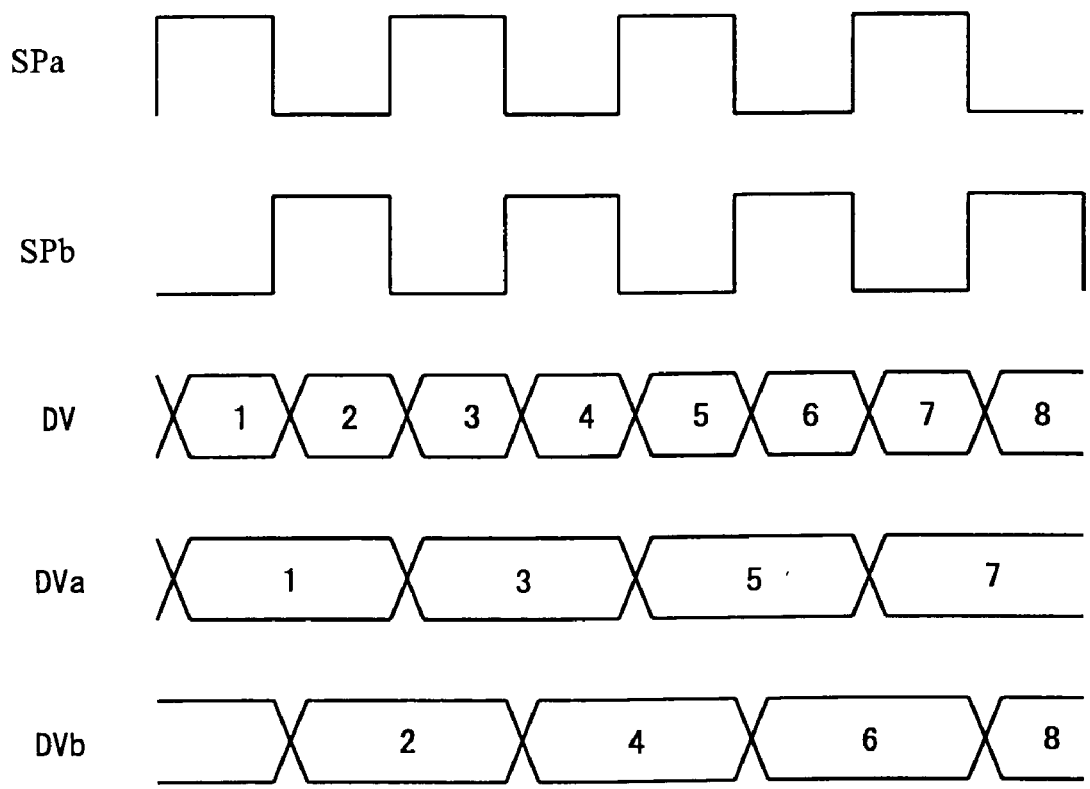
FIG. 2 is a diagram showing the timing of sampling a video signal in the first embodiment.

FIG. 2 is a diagram showing the timing of sampling the video signal DV. When the sampling signal SPa provided to the sampling switch SWa is at high level, the sampling signal SPb provided to the sampling switch SWb is at low level, and inversely, when the sampling signal SPa provided to the sampling switch SWa is at low level, the sampling signal SPb provided to the sampling switch SWb is at high level.

As shown in FIG. 2, when a pixel signal D1 for the first pixel, which is contained in the video signal DV, is inputted to the sampling circuit 400, the sampling signal SPa provided to the sampling switch SWa is at high level, and the sampling signal SPb provided to the sampling switch SWb is at low level. In this case, the sampling switch SWa is turned ON, and the sampling switch SWb is turned OFF. As a result, the pixel signal D1 is sampled by the sampling switch SWa, and then charged and held in the parasitic capacitance Ca.

Next, when a pixel signal D2 for the second pixel is inputted to the sampling circuit 400, the sampling signal SPa provided to the sampling switch SWa is at low level, and the sampling signal SPb provided to the sampling switch SWb is at high level. In this case, the sampling switch SWa is turned OFF, and the sampling switch SWb is turned ON. As a result, the pixel signal D2 is sampled by the sampling switch SWb, and then charged and held in the parasitic capacitance Cb. In this case, the pixel signal D1 being held in the parasitic capacitance Ca is maintained as it is in the parasitic capacitance Ca, and therefore the transmission cycle of the pixel signal D1 after sampling is twice the transmission cycle of the pixel signal D1 contained in the video signal DV.

Next, when a pixel signal D3 for the third pixel is inputted to the sampling circuit 400, the sampling signal SPa provided to the sampling switch SWa is at high level, and the sampling signal SPb provided to the sampling switch SWb is at low level. In this case, the sampling switch SWa is turned ON, and the sampling switch SWb is turned OFF. As a result, the pixel signal D3 is sampled by the sampling switch SWa, and then charged and held in the parasitic capacitance Ca to replace the pixel signal D1. At this time, the pixel data D2 being held in the parasitic capacitance Cb is maintained as it is in the parasitic capacitance Cb, and therefore the transmission cycle of the pixel signal D2 after sampling is twice the transmission cycle of the pixel signal D2 contained in the video signal DV.

Similarly, subsequent pixel signals for odd- and even-numbered pixels are respectively sampled by the sampling switches SWa and SWb and respectively held in the parasitic capacitances Ca and Cb, and they are respectively outputted to the level-conversion circuits 220a and 220b of the source drivers 200a and 200b. In this case, the transmission cycle of each pixel signal is doubled, and therefore the transmission frequency thereof is halved.

<1.4 Sampling Circuit>

In relation to FIGS. 1 and 2, a pixel signal for one pixel, which is contained in the video signal DV, has been described as being sampled as a single signal. In practice, however, a pixel signal for one pixel is composed of a plurality of pieces of bit data, and therefore sampling has to be performed for each piece of bit data.

Figure 3:
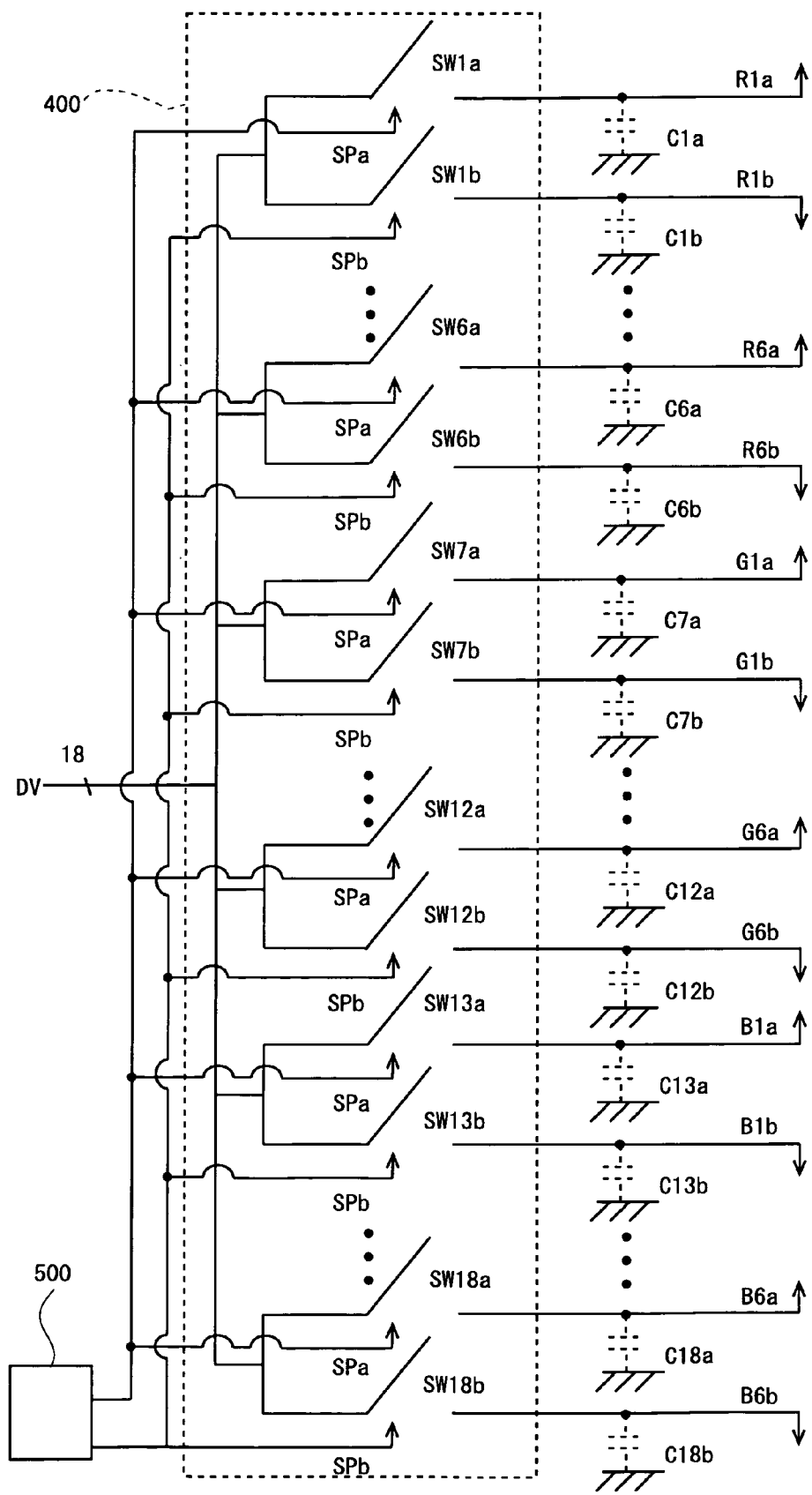
FIG. 3 is a detailed circuit diagram of a sampling circuit in the first embodiment.
Figure 4:
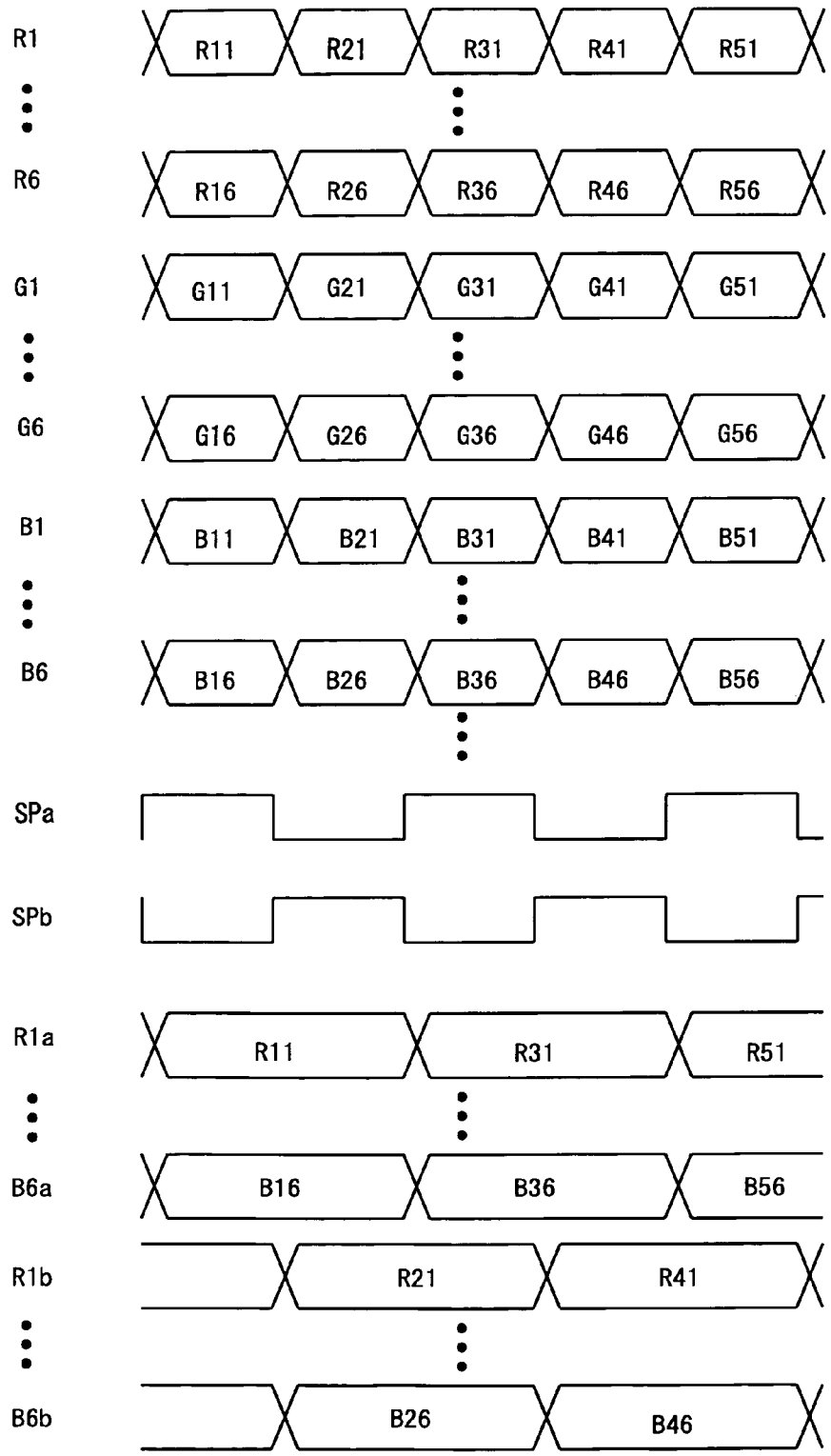
FIG. 4 is a diagram showing in detail the timing of sampling a video signal in the first embodiment.

FIG. 3 is a detailed circuit diagram of the sampling circuit 400 shown in FIG. 1, and FIG. 4 is a diagram showing the timing of sampling the video signal DV.

The sampling circuit 400 is connected to 36 sampling switches SW1a to SW18b, as shown in FIG. 3. Specifically, for example, as in the case of the sampling switches SW1a and SW1b, the sampling switches are initially paired and connected in parallel, and then these 18 pairs of sampling switches connected in parallel are in turn further connected together in parallel.

The sampling switches SW1a to SW18b are connected on the output side to their respective data lines on which parasitic capacitances C1a to C18b are respectively formed. Here, the reason why the sampling switches are connected in parallel two by two is to provide a sampled video signal DV to each of the source drivers 200a and 200b provided respectively above and below the display portion 100.

As shown in FIG. 4, a pixel signal for one pixel is composed of "R", "G", and "B" signals each consisting of 6-bit data. Specifically, the pixel signal for one pixel is a signal containing bit data composed in total of 18 bits with the "R" signal containing bit data R1 to R6, the "G" signal containing bit data G1 to G6, and the "B" signal containing bit data B1 to B6.

A pixel signal for each pixel is sequentially inputted to the sampling circuit 400 as a serial-format video signal DV. Specifically, a pixel signal for the first pixel is inputted, a pixel signal for the second pixel is then inputted, and subsequent pixel signals are sequentially inputted in the same manner.

In this case, 18-bit data contained in each pixel signal is inputted to the sampling circuit 400 as a parallel-format pixel signal. Specifically, the bit data R1 is provided to the sampling switches SW1a and SW1b, and the bit data R2 is provided to the sampling switches SW2a and SW2b. Subsequent pieces of data are similarly provided, including the bit data B6 being provided to the sampling switches SW18a and SW18b.

On the other hand, the sampling switches SW1a to SW18a and the sampling switches SW1b to SW18b respectively receive sampling signals SPa and SPb from the sampling signal generation circuit 500. The sampling signals SPa and SPb are in such a relationship that one of them is at high level while the other is at low level. Therefore, for example, when the sampling switches SW1a to SW18a receive a high-level sampling signal SPa so that they are turned ON, the sampling switches SW1b to SW18b receive a low-level sampling signal SPb so that they are turned OFF.

First, a description will be given regarding the case where a pixel signal for the first pixel is inputted to the sampling circuit 400. In this case, all 18 pieces of bit data R11 to B16 contained in the pixel signal for the first pixel are simultaneously inputted to their respective sampling switches SW1a to SW18b. Specifically, the bit data R11 for the first bit in the "R" signal is provided to the sampling switches SW1a and SW1b. The bit data R12 for the second bit in the "R" signal is provided to the sampling switches SW2a and SW2b. Subsequent pieces of data are similarly provided, including the bit data B16 for the sixth bit in the "B" signal being provided to the sampling switches SW18a and SW18b.

In this case, as shown in FIG. 4, high-level sampling signals SPa are provided to the sampling switches SW1a to SW18a, and low-level sampling signals SPb are provided to the sampling switches SW1b to SW18b. Therefore, the sampling switches SW1a to SW18a are turned ON, and the sampling switches SW1b to SW18b are turned OFF.

As a result, the bit data R11 is sampled and outputted to a data line R1a, and then charged and held in a parasitic capacitance C1a. The bit data R12 is sampled and outputted to a data line R2a, and then charged and held in a parasitic capacitance C2a. Subsequent pieces of data are similarly processed, including the bit data B16 being sampled and outputted to a data line B6a and then charged and held in a parasitic capacitance C18a.

Next, a description will be given regarding the case where a pixel signal for the second pixel is inputted to the sampling circuit 400. In this case, 18 pieces of bit data R21 to B26 included in the pixel signal for the second pixel are simultaneously inputted to their respective sampling switches SW1a to SW18b. Specifically, the bit data R21 for the first bit in the "R" signal is provided to the sampling switches SW1a and SW1b. The bit data R22 for the second bit in the "R" signal is provided to the sampling switches SW2a and SW2b. Thereafter, subsequent pieces of data are similarly provided, including the bit data B26 for the sixth bit of the "B" signal being provided to the sampling switches SW18a and SW18b.

In this case, as shown in FIG. 4, a low-level sampling signal SPa is provided to the sampling switches SW1a to SW18a, and a high-level sampling signal SPb is provided to the sampling switches SW1b to SW18b. Therefore, the sampling switches SW1a to SW18a are turned OFF, and the sampling switches SW1b to SW18b are turned ON.

As a result, the bit data R21 is sampled and outputted to the data line R1b, and then charged and held in the parasitic capacitance C1b. The bit data R22 is sampled and outputted to the data line R2b, and then charged and held in the parasitic capacitance C2b. Thereafter, subsequent pieces of data are similarly processed, including the bit data B26 being sampled and outputted to the data line B6b and then being charged and held in the parasitic capacitance C18b.

Furthermore, a description will be given regarding the case where a pixel signal for the third pixel is inputted to the sampling circuit 400. In this case, 18 pieces of bit data R31 to B36 included in the pixel signal for the third pixel are simultaneously inputted to their respective sampling switches SW1a to SW18b. Specifically, the bit data R31 for the first bit in the "R" signal is provided to the sampling switches SW1a and SW1b. The bit data R32 for the second bit in the "R"

signal is provided to the sampling switches SW2a and SW2b. Thereafter, subsequent pieces of data are similarly provided, including the bit data B36 for the sixth bit of the "B" signal being provided to the sampling switches SW18a and SW18b.

In this case, as shown in FIG. 4, a high-level sampling signal SPa is provided to the sampling switches SW1a to SW18a, and a low-level sampling signal SPb is provided to the sampling switches SW1b to SW18b. Therefore, the sampling switches SW1a to SW18a are turned ON, and the sampling switches SW1b to SW18b are turned OFF.

As a result, the bit data R31 is sampled and outputted to the data line R1a, and then charged and held in the parasitic capacitance C1a. The bit data R32 is sampled and outputted to the data line R2a, and then charged and held in the parasitic capacitance C2a. Thereafter, subsequent pieces of data are similarly processed, including the bit data B36 being sampled and outputted to the data line B6a and then being charged and held in the parasitic capacitance C18a.

In this manner, bit data for odd-numbered pixel signals subjected to serial-parallel conversion is provided to the level-conversion circuit 220a of the source driver 200a provided above the display portion 100. On the other hand, bit data for even-numbered pixel signals subjected to serial-parallel conversion is provided to the level-conversion circuit 220b of the source driver 200b provided below the display portion 100.

<1.5 Sampling Switch>

Figure 5:
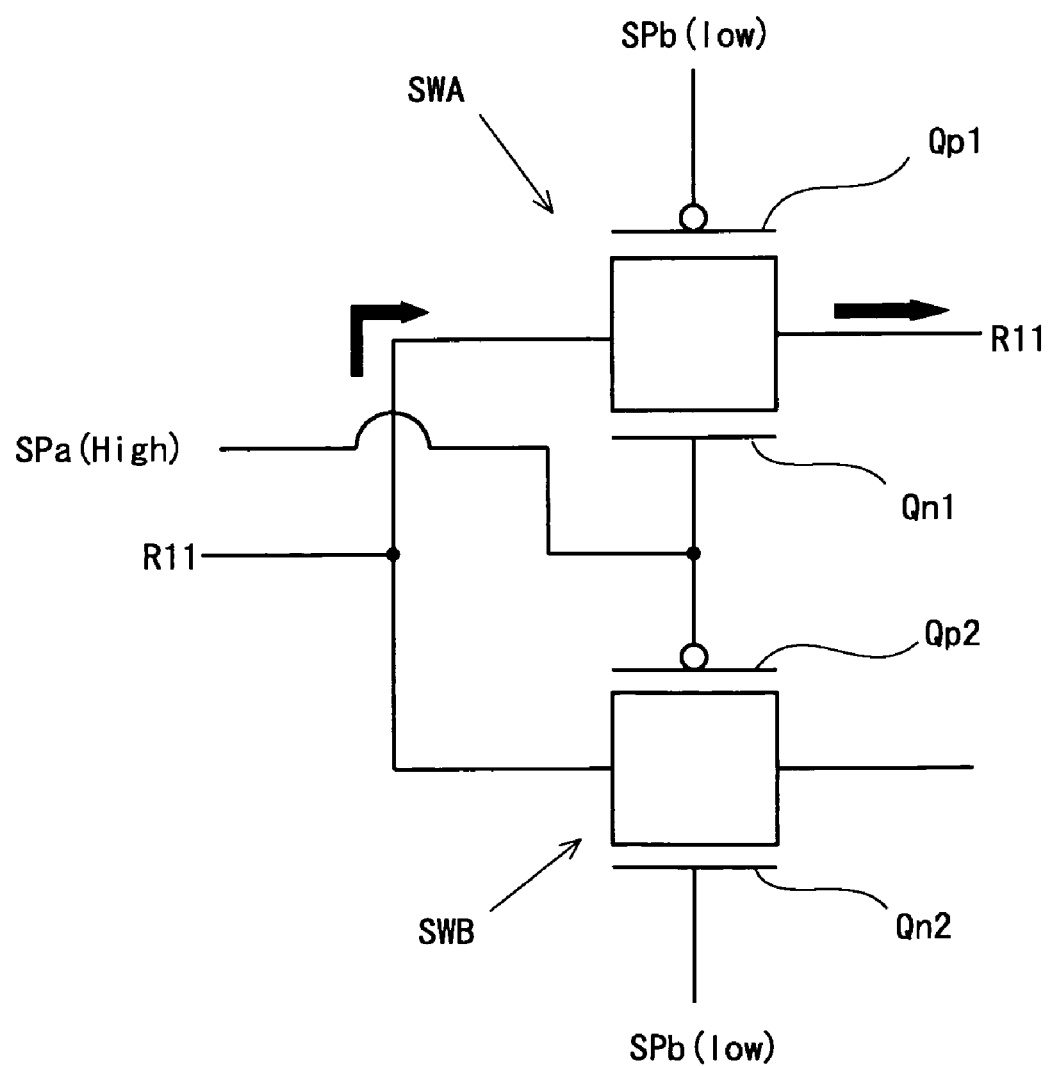
FIG. 5 is a diagram illustrating the configurations of sampling switches in the first embodiment.

Next, the sampling switches will be described. FIG. 5 is a diagram illustrating the configurations of the sampling switches shown in FIG. 3.

As shown in FIG. 5, each of the sampling switches SWA and SWB is formed by an analog switch.

In general, the analog switch is a switch having a P-channel transistor Qp and an N-channel transistor Qn connected source-to-source or drain-to-drain, and capable of transmitting or blocking an analog signal from the source to the drain depending on a voltage applied to the gate.

As shown in FIG. 5, two analog switches SWA and SWB are connected source-to-source, and the analog switch SWA has a sampling signal SPb applied to the gate of a P-channel transistor Qp1 and a sampling signal SPa applied to the gate of an N-channel transistor Qn1. On the other hand, the analog switch SWB has a sampling signal SPa applied to the gate of a P-channel transistor Qp2 and a sampling signal SPb applied to the gate of an N-channel transistor Qn2. Note that in the following descriptions, it is assumed that the analog switches SWA and SWB correspond to the sampling switches SW1a and SW1b, respectively, in FIG. 3, but they also correspond to other sampling switches SW2a to SW18b in the same manner.

A description will be given regarding the case where the analog switches have provided thereto the bit data R11 for the first bit in the "R" signal contained in the pixel signal for the first pixel shown in FIG. 4. In this case, the analog switch SWA has a high-level voltage applied to the gate of the N-channel transistor Qn1 and a low-level voltage applied to the gate of the P-channel transistor Qp1. As a result, both the N-channel transistor Qn1 and the P-channel transistor Qp1 are turned ON, so that the bit data R11 is sampled by the analog switch SWA.

In this case, the analog switch SWB has a low-level voltage applied to the gate of the N-channel transistor Qn2 and a high-level voltage applied to the gate of the P-channel transistor Qp2. As a result, both the N-channel transistor Qn2 and the P-channel transistor Qp2 are turned OFF. Therefore, the bit data R11 is blocked by the analog switch SWB from being sampled.

Next, a description will be given regarding the case where the bit data R21 for the first bit contained in the pixel signal for the second pixel is provided. Contrary to the case of the bit data R11, both the N-channel transistor Qn1 and the P-channel transistor Qp1 of the analog switch SWA are turned OFF, and the N-channel transistor Qn2 and the P-channel transistor Qp2 of the analog switch SWB are turned ON. Therefore, the bit data R21 is sampled by the analog switch SWB.

Note that the sampling switch that can be used in the present embodiment is not limited to the analog switch, and only either the N- or P-channel transistor can be used. For example, when the source drivers 200a and 200b, the gate driver 300, etc., are formed on the insulating substrate using transistors of either N- or P-channel conductivity type, sampling switches are formed using transistors of the same conductivity type as the transistors included in the circuits. In this case, the transistors included in the source drivers 200a and 200b, etc., and the transistors included in the sampling switches are of the same channel conductivity type, and therefore can be formed at the same time by the same production process. Thus, the process for liquid crystal panel production can be simplified.

Also, since the liquid crystal display device according to the present embodiment is of a monolithic driver type, both the N- and P-channel transistors included in the analog switches SWA and SWB are thin film transistors ("TFTs").

<1.6 Parasitic Capacitance>

FIG. 6 is a cross-sectional view illustrating in cross-section the liquid crystal display device shown in FIG. 1. As shown in FIG. 6, laminated in order from bottom, there are a TFT-side glass substrate (hereinafter, referred to as a "TFT-side substrate") 610, a CG silicon layer 620 having formed thereon, for example, sources/drains of MOS transistors, which are elements of the source drivers 200a and 200b, the gate driver 300, etc., a polysilicon layer 630 having formed thereon, for example, gates of the MOS transistors, a metal layer 640 having formed thereon a wiring layer for connecting the MOS transistors, for example, source-to-source, drain-to-drain, or gate-to-gate, a liquid crystal layer 650, and a color filter-side glass substrate (hereinafter, referred to as a "CF-side substrate") 670 having an opposing electrode 660 made of transparent metal such as ITO (indium tin oxide). Here, clock lines for transmitting clock signals in the source drivers 200a and 200b are mainly formed in the polysilicon layer 630, and data lines for transmitting video signals DV from the sampling circuit 400 are mainly formed in the metal layer 640.

Also, the opposing electrode 660 is formed almost across the CF-side substrate 670, and the liquid crystal layer 650 is injected to almost completely fill the space between the TFT-side substrate 610 and the CF-side substrate 670. Moreover, the CG silicon layer 620, the polysilicon layer 630, and the metal layer 640 are formed in this order above the TFT-side substrate 610 peripheral to the display portion 100, with insulating films provided between them.

In the following descriptions, both data lines from the sampling circuit 400 to the source drivers 200a and 200b and data lines in the source drivers are formed in the metal layer 640. In this case, the following are conceivable as the parasitic capacitances Ca and Cb on the data lines.

First, the data lines form parasitic capacitances with the opposing electrode 660 opposite thereto with respect to the liquid crystal layer 650. In this case, since the opposing electrode 660 is formed almost across the CF-side substrate 670, the parasitic capacitances formed between the data lines and the opposing electrode 660 extend across the length of the data lines. However, the data lines and the opposing electrode 660 are partitioned by the liquid crystal layer 650 having a thickness of about 1 mm, and therefore the parasitic capacitances are low.

Next, the data lines form parasitic capacitances with part of gates, etc., formed in the polysilicon layer 630. In this case, the insulating films are thinner than the liquid crystal layer 650, and therefore parasitic capacitances are increased per unit area.

Figure 7:
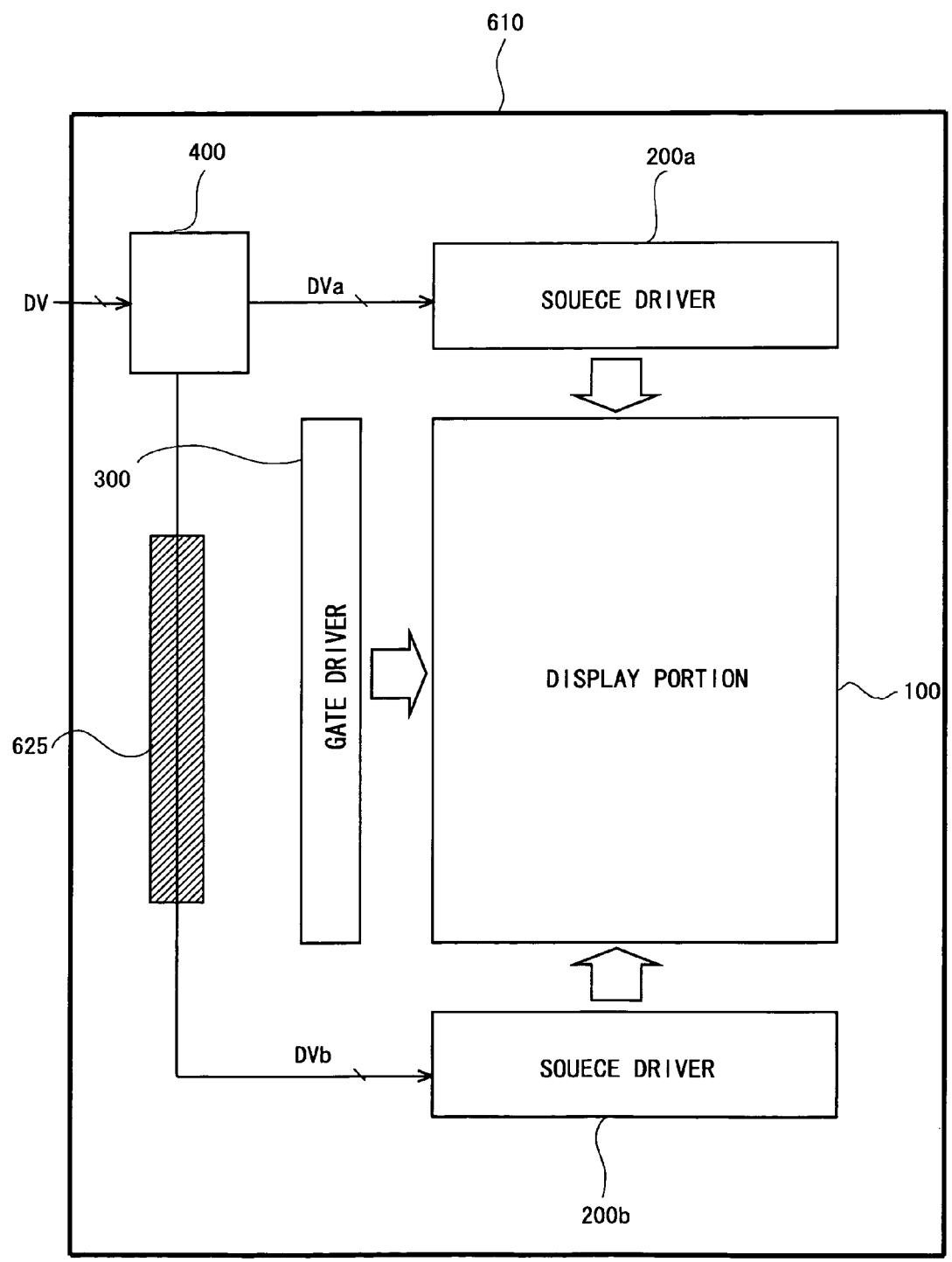
FIG. 7 is a diagram illustrating an exemplary parasitic capacitance utilizing a CG silicon layer in the first embodiment.

Also, the data lines form parasitic capacitances with the CG silicon layer 620. FIG. 7 is a diagram illustrating an exemplary parasitic capacitance utilizing the CG silicon layer 620. The data lines between the sampling circuit 400 and the source drivers 200a and 200b are typically formed above portions of the TFT-side substrate 610 where the CG silicon layer 620 is partially removed. Therefore, a pattern 625 can be formed by the CG silicon layer 620 along the data lines, and can be arranged on the TFT-side substrate 610 with the same width as the data lines, as shown in FIG. 7. Typically, the pattern 625 is formed only considering its relationship with the data lines without being affected by the arrangement of the source drivers 200a and 200b, etc., and therefore the parasitic capacitances can be increased.

Furthermore, the data lines form parasitic capacitances not only with the opposing electrode 660, the polysilicon layer 630, and the CG silicon layer 620, which are disposed above/below the data lines, but also with adjacent lines formed in the same metal layer 640. The parasitic capacitances increase as the intervals from adjacent lines are narrowed.

FIG. 8(A) is a top view illustrating a parasitic capacitance C utilizing a gate capacitance Cg of the MOS transistor, and FIG. 8(B) is a cross-sectional view taken along line A-A in FIG. 8(A). Where a MOS transistor is formed by a gate 730 formed in the polysilicon layer 630 and a source 710a and a drain 710b formed in the CG silicon layer 620, the gate capacitance Cg is formed between the gate 730 and a channel region 720. On the other hand, contact holes 740 are provided in an insulating film on the source 710a and the drain 710b, thereby connecting the source 710a and the drain 710b to the data line 750. As a result, the parasitic capacitance C, which is formed between the gate 730 formed in the polysilicon layer 630 and the data line 750 formed in the metal layer 640, is equalized with the gate capacitance Cg.

Note that in order for the data line 750 to achieve an ohmic contact in the contact holes 740 with the source 710a and the drain 710b, it is necessary to pre-implant ionic impurities into regions of the source 710a and the drain 710b where the contact holes 740 are provided, thereby increasing impurity concentration.

Also, by pre-adjusting the surface concentration of the CG silicon layer 620, for example, via ion implantation such that, for example, an inversion layer is formed on the surface of the CG silicon layer 620 that acts as the channel region 720 upon application to the gate 730 of the N-channel transistor of a voltage greater than or equal to a threshold, the gate capacitance Cg can be maximized and at the same time the parasitic capacitance C is also maximized. In this case, as is apparent from the characteristic curve (C-V characteristics) showing the relationship between the gate voltage and the gate capacitance Cg, zero voltage can be applied to the gate 730 by applying an appropriate negative voltage to the source 710a.

Note that the foregoing has been described with respect to the case where the CG silicon layer 620 is formed as the second layer from the bottom in FIG. 6, the metal layer 640 is formed as the fourth layer from the bottom, and the data line 750 is formed by the metal layer 640. Inversely, the metal layer may be formed as the second layer from the bottom, and the CG silicon layer may be formed as the fourth layer from the bottom. Alternatively, both the second and fourth layers may be formed by the CG silicon layers or by the metal layers. In either case, the data line 750 may be formed in the second layer rather than in the fourth layer.

<1.7 Effect>

An externally provided video signal DV is expanded into two phases by two sets of sampling switches SW1a to SW18a and SW1b to SW18b without being boosted. Accordingly, the sampling circuit 400 can be configured in a simplified manner, and circuit scale for the liquid crystal display device can be reduced when compared to the case where logic circuits are used. Also, since bit data expanded into two phases, such as bit data R11 to B16 and bit data R21 to B26, can be charged and held in the parasitic capacitances C1a to C18a and C1b to C18b as a low-voltage swing signal without being boosted, and then provided to the source drivers 200a and 200b, power consumption by the liquid crystal display device can be minimized.

Furthermore, in the case where serial-parallel conversion is performed by the logic circuits, it is necessary to, for example, boost the video signal DV, and therefore the video signal DV is significantly delayed. On the other hand, in the case where the sampling switches SW1a to SW18a and SW1b to SW18b are turned ON/OFF for sampling, it is not necessary to boost the video signal DV, and therefore such a delay does not occur. Thus, the delay of the video signal DV can be reduced when compared to the case where the sampling is performed by the logic circuits.

Also, the sampled video signal DV can be charged and held in the parasitic capacitances C1a to C18a and C1b to C18b formed, for example, between the data lines and the opposing electrode 660. Accordingly, it is not necessary to provide additional capacitances for holding the sampled video signal DV, and therefore in this regard the circuit scale can be reduced.

<1.8 First Variant>

Next, a first variant of the first embodiment will be described. The first variant differs from the first embodiment in that, although the "R", "G", and "B" signals contained in a pixel signal for one pixel are inputted in parallel to the sampling circuit 400, bit data contained in each signal is inputted in series.

Figure 10:
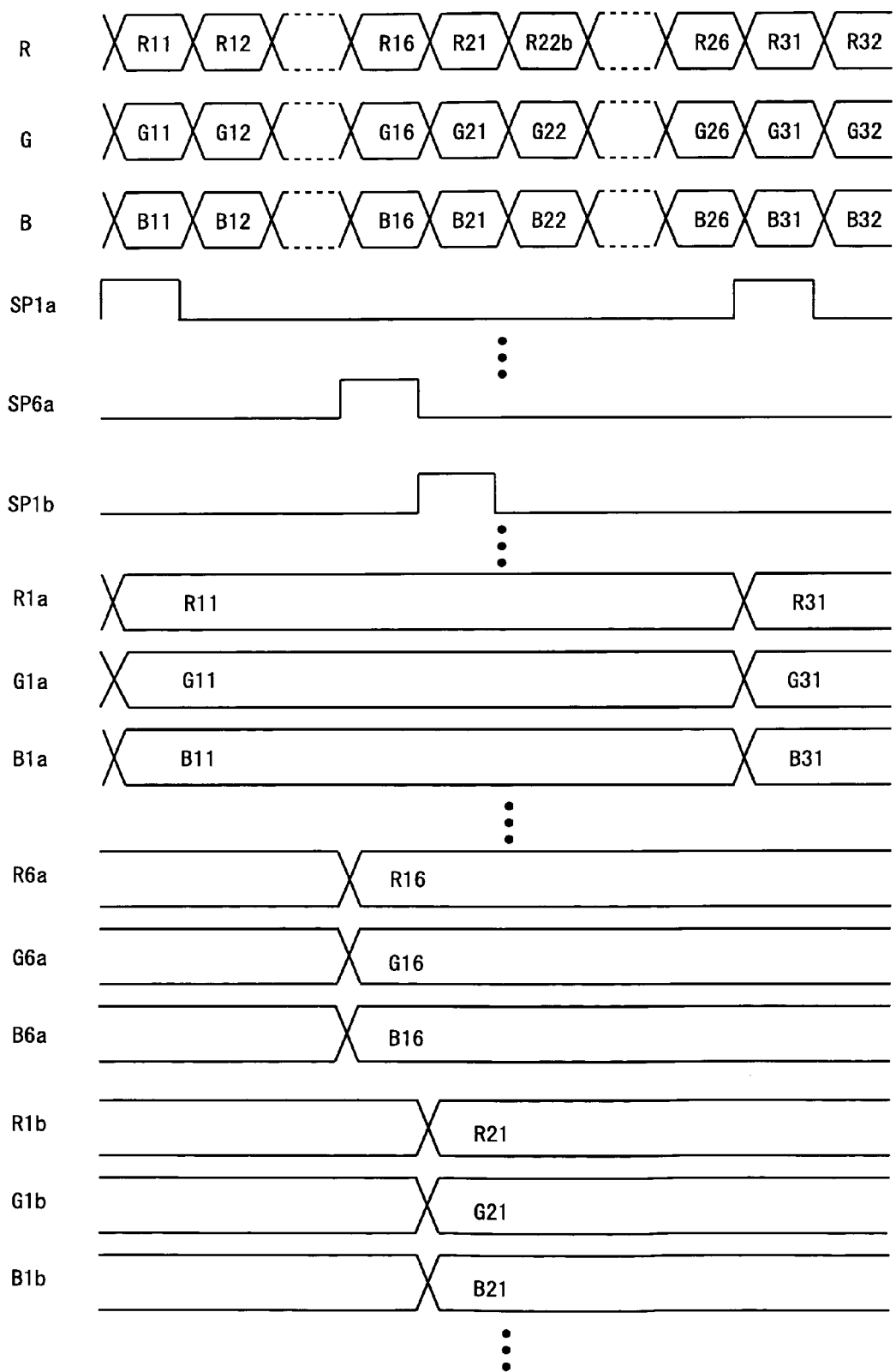
FIG. 10 is a diagram showing the timing of sampling a video signal in the first variant.

FIG. 9 is a detailed circuit diagram of the sampling circuit 400 shown in FIG. 1, and FIG. 10 is a diagram showing the timing of sampling the video signal DV by the sampling circuit 400.

In the sampling circuit 400, 36 sampling switches SW1a to SW18b are grouped into three blocks each consisting of twelve switches, as shown in FIG. 9. The block consisting of the sampling switches SW1a to SW6b samples the "R" signal, the block consisting of the sampling switches SW7a to SW12b samples the "G" signal, and the block consisting of the sampling switches SW13a to SW18b samples the "B" signal.

The sampling switches SW1a to SW18b are respectively turned ON/OFF by sampling signals SPla to SP6b provided by the sampling signal generation circuit 500. Also, the sampling switches SW1a to SW18b are connected on the output side to their respective data lines R1a to B6b with parasitic capacitances C1a to C18b.

A description will be given regarding the case where the "R", "G", and "B" signals are inputted in parallel to the sampling circuit 400. First, the case of sampling bit data contained in the pixel signal for the first pixel will be described. The bit data R11 for the first bit in the "R" signal, the bit data G11 for the first bit in the "G" signal, and the bit data B11 for the first bit in the "B" signal are simultaneously provided to their respective sampling switches Sw1a to SW6b, SW7a to SW12b, and SW13a to SW18b. At this time, only the sampling signal SP1a is at high level, and the other sampling signals are at low level. Therefore, the sampling switches SW1a, SW7a, and SW13a are turned ON, and the other sampling switches are all turned OFF.

As a result, the bit data R11 inputted to the sampling circuit 400 is outputted to the data line R1a via the sampling switch SW1a, and then charged and held in the parasitic capacitance C1a. Similarly, the bit data G11 is outputted to the data line G1a via the sampling switch SW7a, and then charged and held in the parasitic capacitance C7a. The bit data B11 is outputted to the data line B1a via the sampling switch SW13a, and then charged and held in the parasitic capacitance C13a.

Next, the bit data R12 for the second bit in the "R" signal, the bit data G12 for the second bit in the "G" signal, and the bit data B12 for the second bit in the "B" signal are simultaneously provided to their respective sampling switches SW1a to SW6b, SW7a to SW12b, and SW13a to SW18b. At this time, only the sampling signal SP2a is at high level, and the other sampling signals are at low level. Therefore, the sampling switches SW2a, SW8a, and SW14a are turned ON, and the other sampling switches are all turned OFF.

As a result, the bit data R12 inputted to the sampling circuit 400 is outputted to the data line R2a via the sampling switch SW2a, and then charged and held in the parasitic capacitance C2a. Similarly, the bit data G12 is outputted to the data line G2a via the sampling switch SW8a, and then charged and held in the parasitic capacitance C8a. The bit data B12 is outputted to the data line B2a via the sampling switch SW14a, and then charged and held in the parasitic capacitance C14a.

Thereafter, subsequent pieces of data are similarly provided, including the bit data R16 for the sixth bit of the "R" signal, the bit data G16 for the sixth bit of the "G" signal, and the bit data B16 for the sixth bit of the "B" signal, which are simultaneously provided to their respective sampling switches SW1a to SW6b, SW7a to SW12b, and SW13a to SW18b. At this time, only the sampling signal SP6a is at high level, and the other sampling signals are at low level. Therefore, the sampling switches SW6a, SW12a, and SW18a are turned ON, and the other sampling switches are all turned OFF.

Accordingly, the bit data R16 inputted to the sampling circuit 400 is outputted to the data line R6a via the sampling switch SW6a, and then charged and held in the parasitic capacitance C6a. Similarly, the bit data G16 is outputted to the data line G6a via the sampling switch SW12a, and then charged and held in the parasitic capacitance C12a. The bit data B16 is outputted to the data line B6a via the sampling switch SW18a, and then charged and held in the parasitic capacitance C18a.

In this manner, the "R", "G", and "B" signals contained in the pixel signal for the first pixel are sampled for each bit data, and then charged and held in their respective parasitic capacitances C1a to C18a. As a result, each of the "R", "G", and "B" signals contained in the pixel signal for the first pixel is subjected to serial-parallel conversion.

Next, the case of sampling bit data contained in the pixel signal for the second pixel will be described. First, the bit data R21 for the first bit in the "R" signal, the bit data G21 for the first bit in the "G" signal, and the bit data B21 for the first bit in the "B" signal are simultaneously provided to their respective sampling switches SW1a to SW6b, SW7a to SW12b, and SW13a to SW18b. At this time, only the sampling signal SP1a is at high level, and the other sampling signals are at low level. Therefore, the sampling switches SW1b, SW7b, and SW13b are turned ON, and the other sampling switches are all turned OFF.

As a result, the bit data R21 inputted to the sampling circuit 400 is outputted to the data line R1b via the sampling switch SW1b, and then charged and held in the parasitic capacitance C1b. Similarly, the bit data G21 is outputted to the data line G1b via the sampling switch SW7b, and then charged and held in the parasitic capacitance C7b. The bit data B21 is outputted to the data line B1b via the sampling switch SW13b, and then charged and held in the parasitic capacitance C13b. As a result, each of the "R", "G", and "B" signals contained in the pixel signal for the second pixel is subjected to serial-parallel conversion.

Thereafter, subsequent pieces of data are similarly processed, including the bit data R26, G26, and B26 for the sixth bit being charged and held in their respective parasitic capacitances C6b, C12b, and C18b, and then the bit data R31, G31, and B31 for the first bit contained in the pixel signal for the third pixel are charged and held in their respective parasitic capacitances C1a, C7a, C13a.

In this manner, odd-numbered pixel signals subjected to serial-parallel conversion are provided to the level-conversion circuit 220a of the source driver 200a provided above the display portion 100, while even-numbered pixel signals are provided to the level-conversion circuit 220b of the source driver 200b provided below the display portion 100.

FIG. 11 is a diagram illustrating the configuration of the sampling switch, SW1a to SW18b, shown in FIG. 9. While a description will be given by taking the sampling switch SW1a as an example for convenience of explanation, the same applies to the other sampling switches SW1b to SW18b. As shown in FIG. 11, the sampling switch SW1a is formed by an analog switch. The analog switch receives a sampling signal SP1a at the gate of the N-channel transistor Qn and a signal obtained by inverting the sampling signal SP1a through an inverter INV at the gate of the P-channel transistor Qp.

Accordingly, for example, when the analog switch has the bit data R11 for the first bit in the "R" signal provided to the source, the sampling signal SP1a is at high level. Accordingly, a high-level signal is applied to the gate of the N-channel transistor Qn, and a low-level signal is applied to the gate of the P-channel transistor Qp. As a result, both the N- and P-channel transistors Qn and Qp are turned ON so that the bit data R11 is sampled.

Next, for example, when the bit data R12 for the second bit in the "R" signal is provided to the source, the sampling signal SP1a is at low level. Accordingly, a low-level signal is applied to the gate of the N-channel transistor Qn, and a high-level signal is applied to the gate of the P-channel transistor Qp. As a result, both the N- and P-channel transistors Qn and Qp are turned OFF so that the bit data R12 is blocked by the sampling switch SW1a.

That is, the sampling switch samples bit data only when the sampling signal is at high level, and blocks bit data when the sampling signal is at low-level.

Note that as in the case of the first embodiment, the sampling switches SW1a to SW18b may be formed by either an N- or P-channel transistor rather than an analog switch. Also, since the liquid crystal display device according to this variant is of a monolithic driver type, the N- and P-channel transistors of the sampling switches SW1a to SW18b are all thin-film transistors.

In this variant, a set of sampling switches SW1a to SW18a are used to perform serial-parallel conversion so that the "R", "G", and "B" signals that are inputted in serial format can be converted into parallel format. Also, two sets of sampling switches SW1a to SW18a and SW1b to SW18b are provided so that each of the "R", "G", and "B" signals subjected to serial-parallel conversion can be expanded into two phases. In general, when a plurality of sets of sampling switches, the "R", "G", and "B" signals subjected to serial-parallel conversion can be expanded into phases the number of which corresponds to the number of sets.

<1.9 Second Variant>

Next, a second variant of the first embodiment will be described. The second variant differs from the first embodiment in that the "R", "G", and "B" signals contained in the pixel signal for one pixel are inputted in series to the sampling circuit 400 in the order: bit data R1 to R6 of the "R" signal; bit data G1 to G6 of the "G" signal; and bit data B1 to B6 of the "B" signal.

Figure 12:
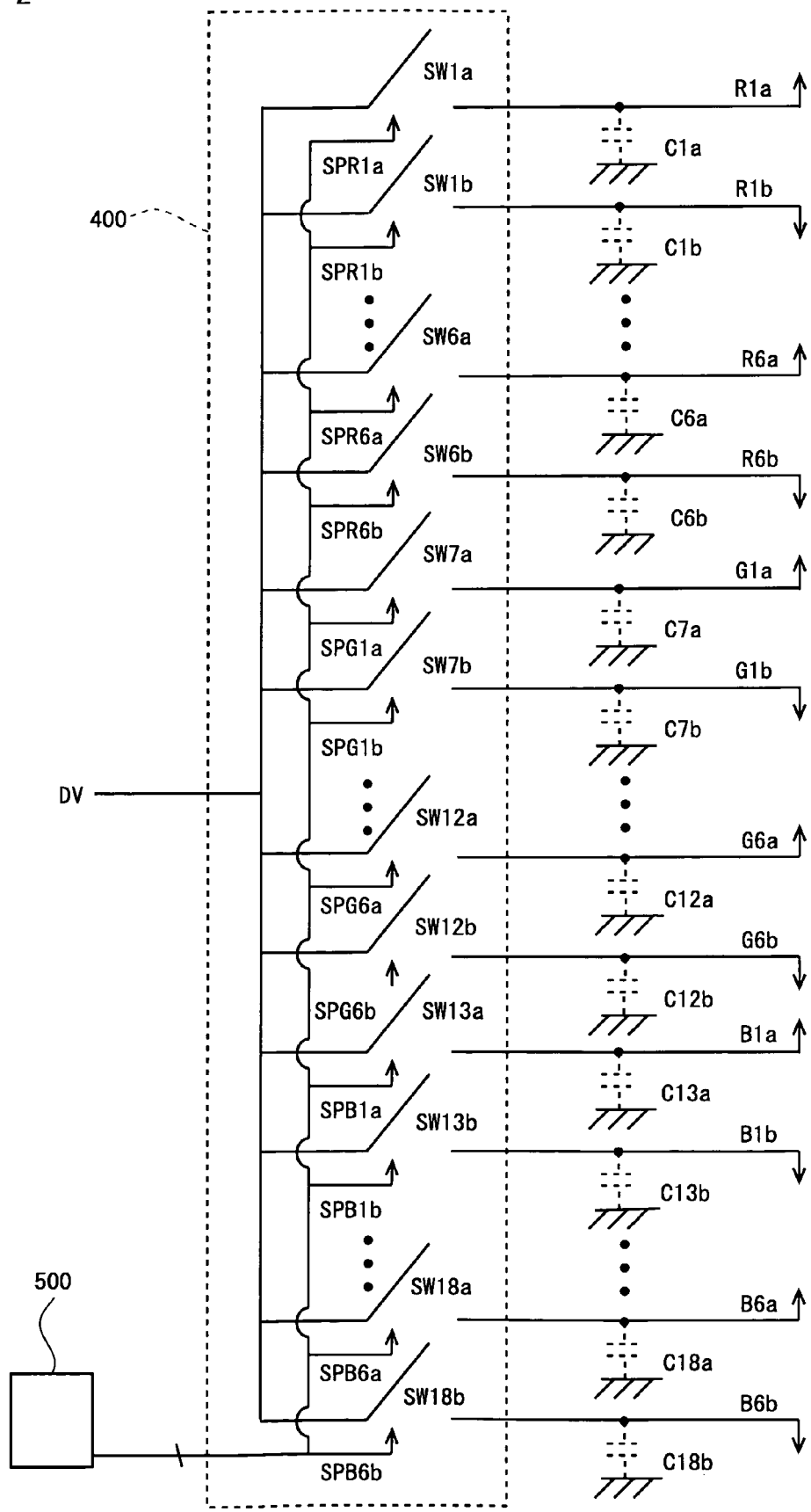
FIG. 12 is a detailed circuit diagram of a sampling circuit according to a second variant of the first embodiment.
Figure 13:
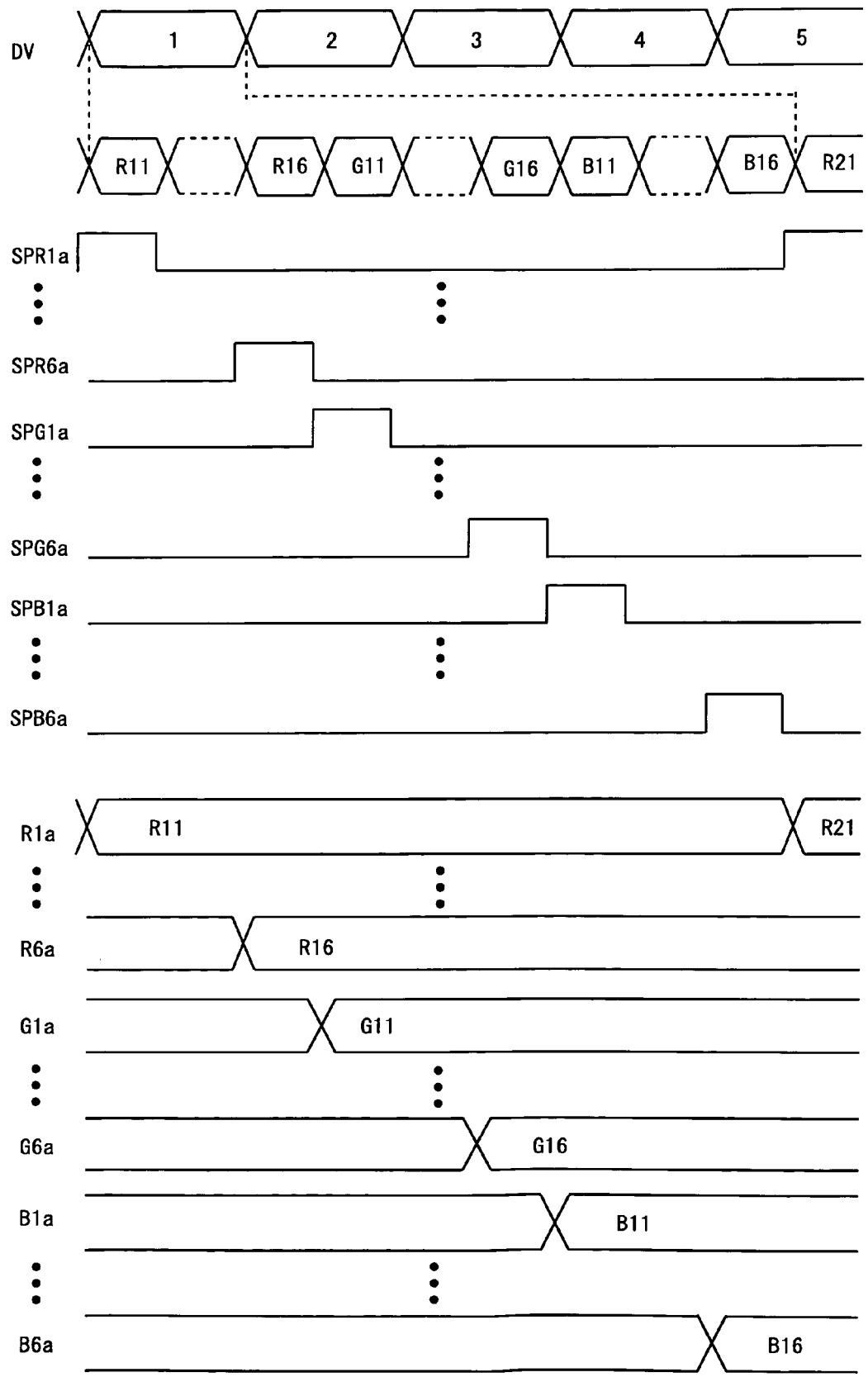
FIG. 13 is a diagram showing the timing of sampling a video signal in the second variant.

FIG. 12 is a detailed circuit diagram of the sampling circuit 400 shown in FIG. 1, and FIG. 13 is a diagram showing the timing of sampling the video signal DV by the sampling circuit 400.

The sampling circuit 400 has 36 sampling switches SW1a to SW18b connected in parallel, as shown in FIG. 12. The sampling switches SW1a to SW18b are turned ON/OFF in accordance with their respective sampling signals SPR1a to SPB6b provided by the sampling signal generation circuit 500. Also, the sampling switches SW1a to SW18b are connected on the output side to their respective data lines R1a to B6b with parasitic capacitances C1a to C18b.

First, a description will be given regarding the case where the pixel signal for the first pixel is sampled. Initially, the bit data R11 for the first bit in the "R" signal is provided to all the sampling switches SW1a to SW18b. At this time, only the sampling signal SPR1a is at high level, and the other sampling signals are at low level, so that only the sampling switch SW1a is turned ON, and the other sampling switches are turned OFF. Accordingly, the bit data R11 is sampled by the sampling switch SW1a, and then charged and held in the parasitic capacitance C1a.

Next, the bit data R12 for the second bit in the "R" signal is provided to all the sampling switches SW1a to SW18b. At this time, only the sampling signal SPR2a is at high level, and the other sampling signals are at low level, so that only the sampling switch SW2a is turned ON, and the other sampling switches are turned OFF. Accordingly, the bit data R12 is sampled by the sampling switch SW2a, and then charged and held in the parasitic capacitance C2a.

Thereafter, subsequent pieces of data are similarly provided, including the bit data B16 for the sixth bit in the "B" signal being provided to all the sampling switches SW1a to SW18b. At this time, only the sampling signal SPB6a is at high level, and the other sampling signals are at low level, so that only the sampling switch SW18a is turned ON, and the other sampling switches are turned OFF. Accordingly, the bit data B16 is sampled by the sampling switch SW18a, and then charged and held in the parasitic capacitance C18a.

As a result, 18 pieces of bit data R11 to B16 contained in the pixel signal for the first pixel are respectively held in 18 parasitic capacitances C1a to C18a, and further provided to the level-conversion circuit 220a of the source driver 200a. That is, the 18 pieces of bit data R11 to B16 contained in the pixel signal for the first pixel are subjected to serial-parallel conversion.

Next, a description will be given regarding the case where the pixel signal for the second pixel is sampled. The bit data R21 for the first bit in the "R" signal is provided to all the sampling switches SW1a to SW18b. At this time, only the sampling signal SPR1b is at high level, and the other sampling signals are at low level, so that only the sampling switch SW1b is turned ON, and the other sampling switches are turned OFF. Accordingly, the bit data R21 is sampled by the sampling switch SW1b, and then charged and held in the parasitic capacitance C1b.

Next, the bit data R22 for the second bit in the "R" signal is provided to all the sampling switches SW1a to SW18b. At this time, only the sampling signal SPR2b is at high level, and the other sampling signals are at low level, so that only the sampling switch SW2b is turned ON, and the other sampling switches are turned OFF. Accordingly, the bit data R22 is sampled by the sampling switch SW2b, and then charged and held in the parasitic capacitance C2b.

Thereafter, subsequent pieces of data are similarly provided, including the bit data B26 for the sixth bit in the "B" signal being provided to all the sampling switches SW1a to SW18b. At this time, only the sampling signal SPB6b is at high level, and the other sampling signals are at low level, so that only the sampling switch SW18b is turned ON, and the other sampling switches are turned OFF. Accordingly, the bit data B26 is sampled by the sampling switch SW18b, and then charged and held in the parasitic capacitance C18b.

As a result, 18 pieces of bit data R21 to B26 contained in the pixel signal for the second pixel are respectively held in 18 parasitic capacitances C1b to C18b, and further provided to the level-conversion circuit 220b of the source driver 200b. That is, the 18 pieces of bit data R21 to B26 contained in the pixel signal for the second pixel are subjected to serial-parallel conversion.

In this manner, odd-numbered pixel signals subjected to serial-parallel conversion are provided to the level-conversion circuit 220a of the source driver 200a provided above the display portion 100. On the other hand, even-numbered pixel signals are subjected to serial-parallel conversion, and provided to the level-conversion circuit 220b of the source driver 200b provided below the display portion 100.

Note that each of the sampling switches SW1a to SW18b shown in FIG. 12 is configured in the same manner as the analog switch shown in FIG. 11, and therefore any descriptions thereof will be omitted. Also, as in the first embodiment, the sampling switches SW1a to SW18b may be formed by either an N- or P-channel transistor rather than an analog switch.

In this variant, one set of sampling switches SW1a to SW18a are used for serial-parallel conversion so that the video signal DV inputted in serial format can be converted into parallel format. Also, two sets of sampling switches SW1a to SW18a and SW1b to SW18b are provide so that the video signal DV inputted in serial format can be expanded into two phases. In general, when there are a plurality of sets of sampling switches, the video signal DV inputted in serial format can be expanded into phases the number of which corresponds to the number of sets.

2. Second Embodiment

<2.1 Overall Configuration>

Figure 14:
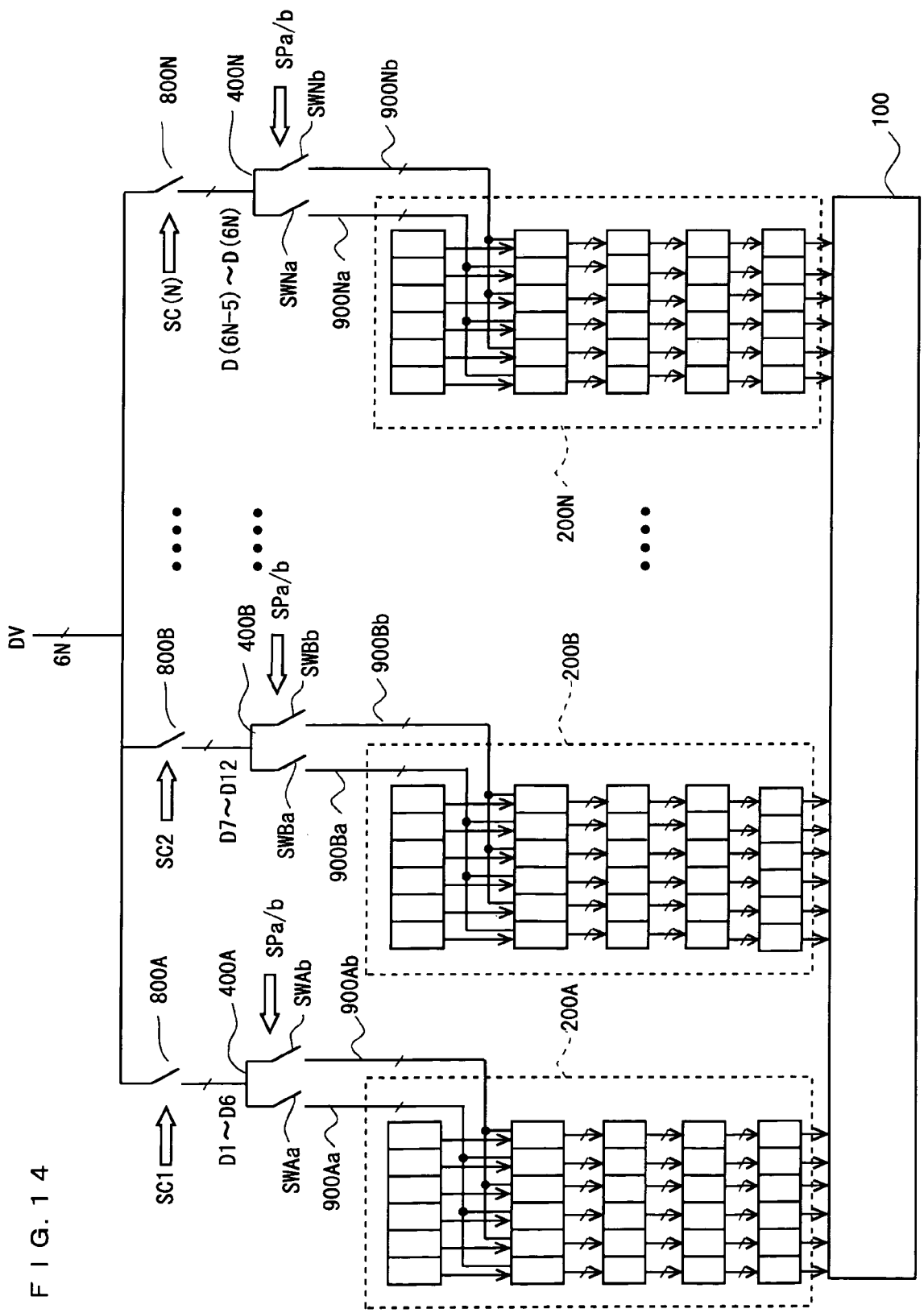
FIG. 14 is a block diagram illustrating the configuration of a liquid crystal display device according to a second embodiment of the present invention.

FIG. 14 is a block diagram illustrating the configuration of a liquid crystal display device according to a second embodiment of the present invention. As shown in FIG. 14, N change-over switches 800A to 800N are arranged in parallel, and the change-over switches 800A to 800N are connected to N sampling circuits 400A to 400N, respectively. Also, the sampling circuits 400A to 400N are connected to N source drivers 200A to 200N, respectively. The source drivers 200A to 200N output drive video signals to their respective source bus lines formed on the display portion 100.

Here, each of the sampling circuits 400A to 400N includes a pair of sampling switches connected in parallel from among SWAa to SWNb. The pairs of sampling switches SWAa to SWNb are connected to the source drivers 200A to 200N, respectively, via data lines 900Aa to 900Nb.

Also, unlike the source drivers 200a and 200b in the first embodiment, the source drivers 200A to 200N are all disposed above the display portion 100. The source drivers 200A to 200N are configured substantially in the same manner by integrating the source drivers 200a and 200b as units. Note that in order to achieve wide intervals between output terminals of the source drivers 200A to 200N, the source drivers 200A to 200N may be divided into two groups to be disposed above and below the display portion 100, as in the first embodiment. Any detailed description will be omitted regarding the configuration of each of the source drivers 200A to 200N.

The change-over switches 800A to 800N are intended to sequentially provide inputted video signals DV to the source drivers 200A to 200N, and each of them is formed by the same analog switch as shown in FIG. 11. However, in the case where each of the sampling switches SWAa to SWNb is formed by either an N- or P-channel transistor, if each of the change-over switches is formed by a transistor of the same conductivity type as the sampling switch, the process for producing the liquid crystal display device can be simplified.

Note that the sampling switches SWAa to SWNb are each formed by the same analog switch as shown in FIG. 5.

<2.2 Operation>

The operation of the liquid crystal display device will be described. For simplification of explanation, a video signal DV for one horizontal period is assumed to contain 6N pixel signals D1 to D(6N).

Figure 15:
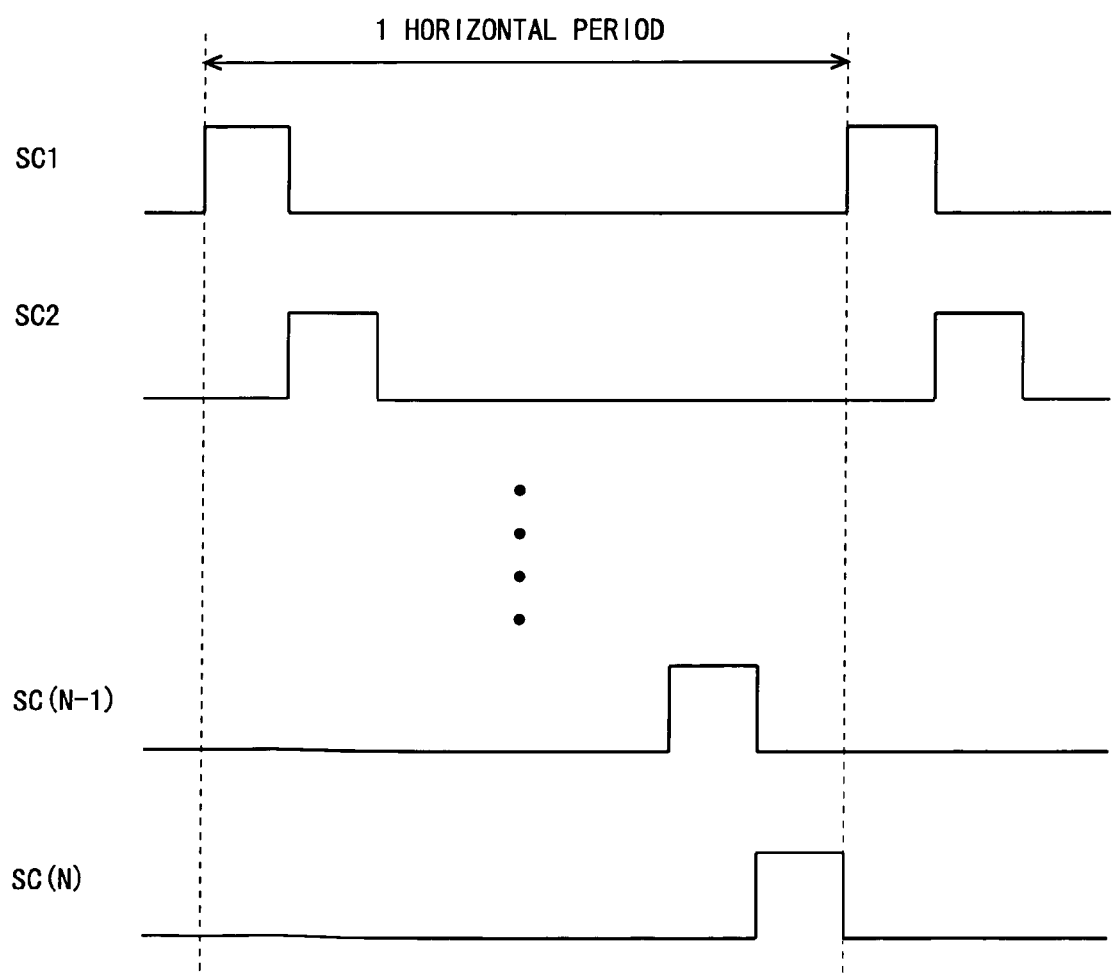
FIG. 15 provides waveform charts of change-over signals for sequentially turning ON/OFF change-over switches within one horizontal period in the second embodiment.

FIG. 15 provides waveform charts of change-over signals SC1 to SC (N) for sequentially turning ON/OFF the change-over switches 800A to 800N within one horizontal period.

First, to turn the change-over switch 800A ON, a high-level change-over signal SC1 is provided to the change-over switch 800A. While the change-over switch 800A is ON, pixel signals D1 to D6 are sampled. Then, after a lapse of a predetermined time period, the change-over signal SC1 is brought into low level, so that the change-over switch 800A is turned OFF.

Next, when the change-over signal SC1 is brought into low level, a change-over signal SC2 provided to the change-over switch 800B is brought into high level. While the change-over switch 800B is ON, pixel signals D7 to D12 are sampled. Then, after a lapse of a predetermined time period, the change-over signal SC2 is brought into low level, so that the change-over switch 800b is turned OFF.

Similarly, subsequent signals are sequentially sampled, and ultimately, pixel signals D(6N-5) to D(6N) are sampled by the change-over switch 800N, so that all the pixel signals D1 to D(6N), each corresponding to one horizontal period, are loaded.

Figure 16:
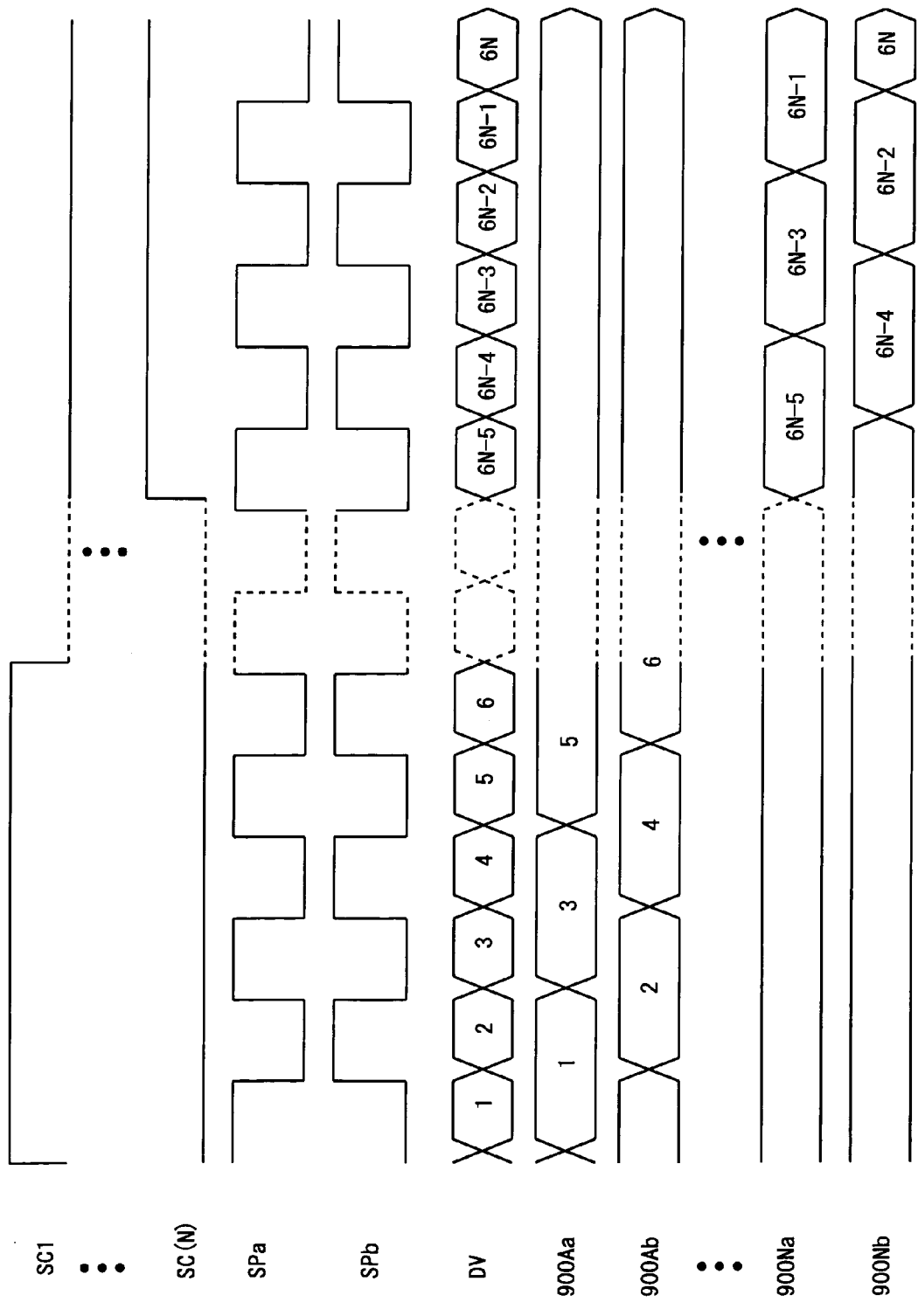
FIG. 16 is a diagram illustrating the timing of distributing video data to data lines in the second embodiment.

FIG. 16 is a diagram illustrating the timing of distributing the pixel signals D1 to D (6N) to the data lines 900Aa to 900Nb. As described in relation to FIG. 15, the change-over signals SC1 to SC (N) are sequentially provided to the change-over switches 800A to 800N. Also, the sampling signal SPa is provided to the sampling switches SWAa to SWNa, and the sampling signal SPb is provided to the sampling switches SWAb to SWNb.

Accordingly, as shown in FIG. 16, when the high-level change-over signal SC1 is provided to the change-over switch 800A, the high-level sampling signal SPa is provided to the sampling switch SWAa, and the low-level sampling signal SPb is provided to the sampling switch SWAb, the sampling switches SWAa and SWAb are turned ON and OFF, respectively. As a result, the pixel signal D1 is provided to the data line 900Aa connected to the sampling switch SWAa, and then charged and held in the parasitic capacitance. Note that at this time, the low-level change-over signals SC2 to SC(N) are provided to the change-over switches 800B to 800N, respectively, the pixel signal D1 is not provided to the other data lines 900Ba to 900Nb.

Next, when the sampling signals SPa and SPb are brought into low and high levels, respectively, with the change-over signal SC1 provided to the change-over switch 800A remaining at high level, the sampling switches SWAa and SWAb are turned OFF and ON, respectively. As a result, the pixel signal D2 is provided to the data line 900Ab connected to the sampling switch SWAb, and then charged and held in the parasitic capacitance. At this time, the pixel signal D1 is held in the parasitic capacitance on the data line 900Aa.

Then, when the sampling signals SPa and SPb are brought into high and low levels, respectively, with the change-over signal SC1 provided to the change-over switch 800A remaining at high level, the sampling switches SWAa and SWAb are turned ON and OFF, respectively. As a result, the pixel signal D3 is replaced by the pixel signal D1 being held in the parasitic capacitance on the data line 900Aa. At this time, the pixel signal D2 is held in the parasitic capacitance on the data line 900Ab.

Subsequently, the sampling signals SPa and SPb are similarly switched with the change-over signal SC1 provided to the change-over switch 800A remaining at high level, so that the pixel signal D5 is charged and held in the parasitic capacitance on the data line 900Aa, and the pixel signals D4 and D6 are charged and held in the parasitic capacitance on the data line 900Ab.

Next, when the sampling signals SPa and SPb are brought into high and low levels, respectively, with the change-over signal SC2 provided to the change-over switch 800B remaining at high level, the sampling switches SWBa and SWBb are turned ON and OFF, respectively. As a result, the pixel signal D7 is charged and held in the parasitic capacitance on the data line 900Ba connected to the sampling switch SWBa.

Subsequent signals are similarly provided, including the high-level change-over signal SC(N) and the pixel signal D(6N) being provided to the change-over switch 800N and the data line 900Nb, respectively. Consequently, the pixel signals D1 to D(6N), each corresponding to one horizontal period, are provided to the source drivers 200A to 200N.

The source drivers 200A to 200N process the pixel signals D1 to D(6N) in the same manner as described in the first embodiment or the variants thereof, and output drive video signals to the source bus lines of the display portion 100, thereby displaying video on the display portion 100.

<2.3 Effect>

The liquid crystal display device having the source drivers 200A to 200N arranged therein also achieves the same effects as those achieved by the liquid crystal display device in the first embodiment, provided that the sampling switches SWAa to SWNb and the change-over switches 800A to 800N are provided in association with their respective source drivers 200A to 200N.

INDUSTRIAL APPLICABILITY

The present invention is applicable to liquid crystal display devices having a display portion for providing a gradation display of video and circuits for driving the display portion formed on the same insulating substrate, i.e., monolithic driver-type liquid crystal display devices, and the invention is particularly suitable for monolithic driver-type liquid crystal display devices with low power consumption.

The invention claimed is:

1. A monolithic driver-type display device for providing a gradation display of video, comprising:
   a first insulating substrate;
   a display portion including a plurality of scanning signal lines, a plurality of video signal lines crossing the scanning signal lines, and a plurality of display elements arranged in a matrix at their corresponding intersections between the scanning signal lines and the video signal lines;
   a scanning signal line driver circuit for selectively activating the scanning signal lines;
   a plurality of switching elements provided in association with a plurality of pieces of bit data contained in externally inputted digital video signals and sampling the digital video signals for each piece of bit data;
   a sampling signal generation circuit for generating sampling signals for opening/closing the switching elements;
   a video signal line driver circuitry for amplifying the sampled digital video signals in such a swing as to enable processing, thereafter generating analog video signals by selecting one gradation voltage for each analog video signal from among a group of provided gradation voltages, based on the amplified digital video signals, and outputting the generated analog video signals to the video signal lines; and
   a plurality of data lines provided between the switching elements and the video signal line driver circuitry, the data lines each having a parasitic capacitance, wherein,
   at least the display portion and the video signal line driver circuitry are formed on the first insulating substrate, and
   the switching elements are independently opened/closed based on the sampling signals, thereby performing a sample and hold operation for sampling and outputting the digital video signals for each piece of bit data to the data lines, whereby the outputted digital video signals are held in the parasitic capacitances on the data lines.

2. The monolithic driver-type display device according to claim 1, wherein,
   the digital video signals each contain a parallel video signal having the pieces of bit data arranged in bit-parallel form,
   the switching elements include a plurality of sets of switching elements, one set being provided for each piece of the bit data, and
   the sampling signal generation circuit generates the sampling signals such that, each time a piece of the bit data for the parallel video signal is externally inputted, the switching elements in the same set are sequentially opened/closed and switching elements, one selected from each set, are simultaneously opened/closed.

3. The monolithic driver-type display device according to claim 1, wherein,
   the digital video signals each contain a serial video signal having the pieces of bit data arranged in bit-serial form, and
   the sampling signal generation circuit generates the sampling signals such that, each time a piece of the bit data for the serial video signal is inputted, the switching elements are sequentially opened/closed.

4. The monolithic driver-type display device according to claim 1, wherein,
   the digital video signals each contain a predetermined number of color video signals representing color video composed of the predetermined number of colors and having a plurality of pieces of bit data arranged in bit-serial form for each of the predetermined number of colors,
   the switching elements include a predetermined number of sets of switching elements, each set corresponding to the pieces of bit data for one of the color video signals, and
   the sampling signal generation circuit generates the sampling signals such that, each time a piece of the bit data for the color video signal is externally inputted, the sampling elements in the same set are sequentially opened/closed and switching elements, one selected from each set, are simultaneously opened/closed.

5. The monolithic driver-type display device according to claim 1, wherein the switching elements are analog switching elements.

6. The monolithic driver-type display device according to claim 1, wherein,
   the video signal line driver circuitry includes MOS thin-film transistors each having a channel of either a first or second conductivity type, and
   the switching elements are formed by MOS thin-film transistors each having a channel of the same conductivity type as the MOS thin-film transistors included in the video signal line driver circuitry.

7. The monolithic driver-type display device according to claim 1, wherein,
   the video signal line driver circuitry includes:
      a first video signal line driver circuit provided on one side of the display portion; and
      a second video signal line driver circuit provided on a side opposite to the one side,
   the switching elements include:
      a first set of switching elements for sampling the digital video signals to be outputted to the first video signal line driver circuit; and
      a second set of switching elements for sampling the digital video signals to be outputted to the second video signal line driver circuit, and
   the first set of switching elements and the second set of switching elements are complementarily opened/closed based on the sampling signals, thereby outputting the digital video signals to either the first or second video signal line driver circuit.

8. The monolithic driver-type display device according to claim 1, further comprising a second insulating substrate opposed to the first insulating substrate and having an electrode positioned to at least face the data lines, wherein,
   the data lines each have the parasitic capacitance formed between the data line and the electrode.

9. The monolithic driver-type display device according to claim 1, further comprising a silicon layer formed on the first insulating substrate, wherein,
   the data lines each have the parasitic capacitance formed between the data line and wiring formed in the silicon layer.

10. The monolithic driver-type display device according to claim 9, further comprising a wiring layer formed above the silicon layer with the first insulating film positioned therebetween, the wiring layer being different from a wiring layer in which the data lines are formed, wherein, the data lines each have the parasitic capacitance formed between the data line and wiring formed in the different wiring layer.

11. The monolithic driver-type display device according to claim 10, further comprising MOS transistors each having a source and a drain formed in the silicon layer on the first insulating substrate and a gate formed in the different wiring layer, wherein, the data lines are each connected to the source and the drain and have the parasitic capacitance formed between the data line and the gate with a gate capacitance of the MOS transistor intervening therebetween.

12. The monolithic driver-type display device according to claim 1, wherein the data lines each have the parasitic capacitance formed between the data line and wiring formed in the same wiring layer as the wiring layer in which the data lines are formed.

* * * * *